(12) United States Patent
Yamagami

(10) Patent No.: US 6,982,912 B2
(45) Date of Patent: Jan. 3, 2006

(54) SEMICONDUCTOR MEMORY DEVICE

(75) Inventor: Yoshinobu Yamagami, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

(21) Appl. No.: 10/833,922

(22) Filed: Apr. 28, 2004

(65) Prior Publication Data

US 2004/0246793 A1    Dec. 9, 2004

(30) Foreign Application Priority Data

Jun. 9, 2003    (JP)    ............................. 2003-164165

(51) Int. Cl.
    *G11C 29/00*    (2006.01)

(52) U.S. Cl. ............. 365/200; 365/230.06; 365/230.08
(58) Field of Classification Search ................ 365/200, 365/230.06, 230.08
    See application file for complete search history.

(56) References Cited

U.S. PATENT DOCUMENTS 5,889,711 A * 3/1999 Yang et al. .................. 365/200
6,762,971 B2 * 7/2004 Yamagami ............. 365/230.06

FOREIGN PATENT DOCUMENTS

JP           11-213690        8/1999

* cited by examiner

*Primary Examiner*—Huan Hoang
(74) *Attorney, Agent, or Firm*—Pearne & Gordon LLP

(57) ABSTRACT

The semiconductor memory device comprises a plurality of word lines including one or more redundant word lines; a plurality of pairs of bit lines; a plurality of memory cells connected to the above-mentioned plurality of word lines and the above-mentioned plurality of pairs of bit lines; a plurality of word-line drivers, each of which is connected to respective one ends of the above-mentioned plurality of word lines and controlled by a plurality of word-line control signals; and a plurality of first word-line control circuits respectively located at the other ends of the above-mentioned plurality of word lines, each of the above-mentioned plurality of first word-line control circuits receiving a signal level of a corresponding one of the above-mentioned plurality of word lines.

9 Claims, 11 Drawing Sheets

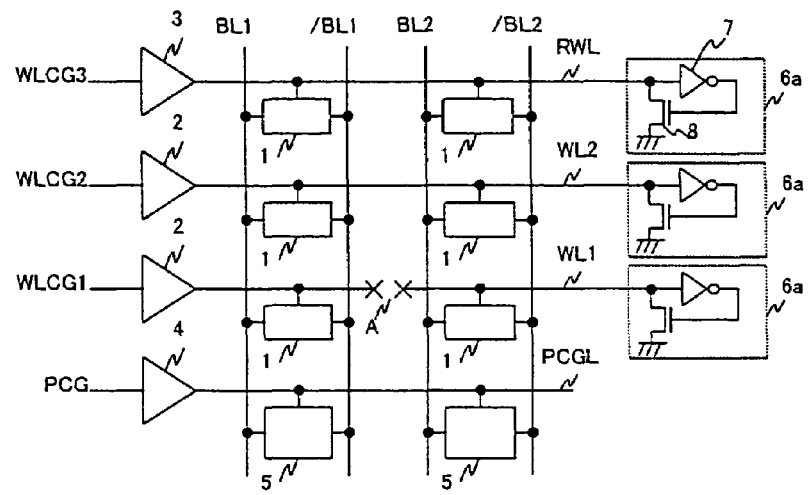
F I G. 1
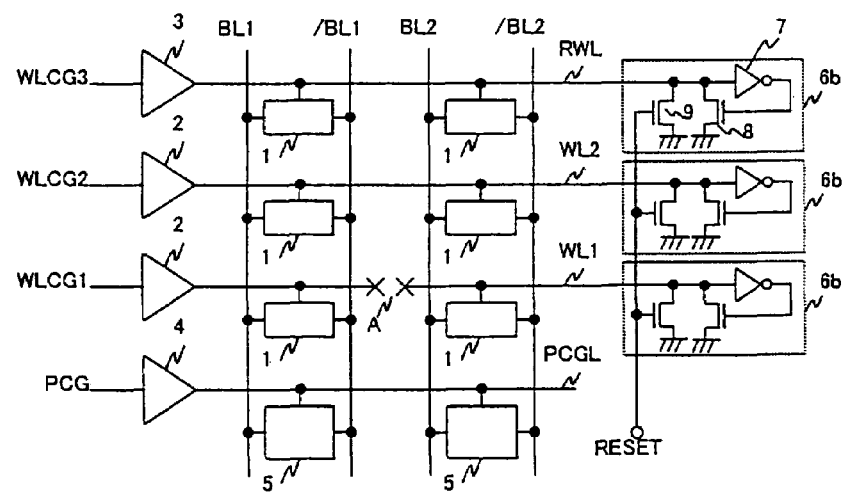
F I G. 2

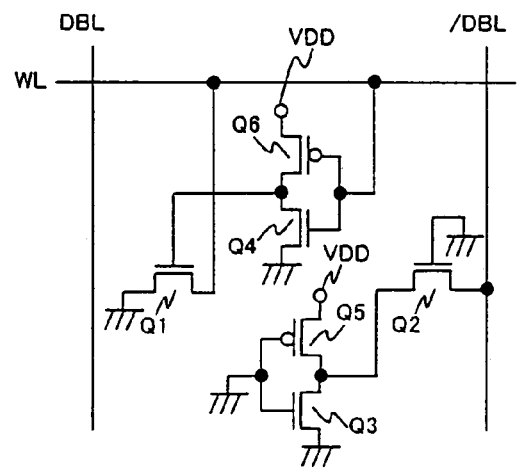
F I G. 6
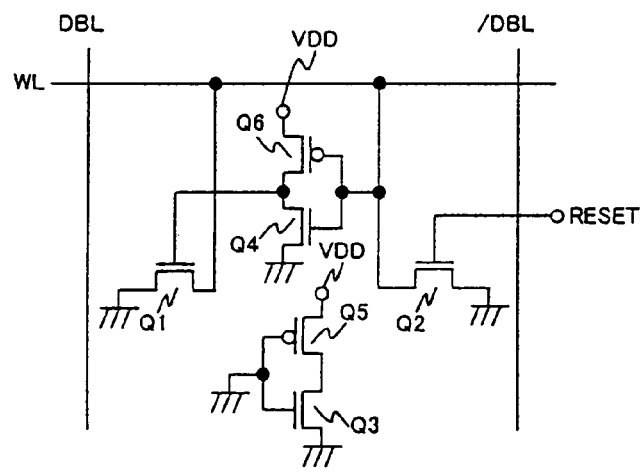
F I G. 7

SEMICONDUCTOR MEMORY DEVICE

BACKGROUND OF THE INVENTION

The present invention relates to a semiconductor memory device having a redundancy relief circuit.

In general, a semiconductor memory device such as a static random access memory (SRAM) and a dynamic random access memory (DRAM) places a redundancy memory cell array in addition to a regular memory cell array on a chip in order to improve its yield. When it is determined that a defective memory cell exists in the regular memory cell array in the test process of the semiconductor memory device, the defective memory cell is replaced with the redundancy memory cell, thereby to complete the semiconductor memory device as a non-defective unit. That is, so-called redundancy relief is performed.

The technology of a prior art semiconductor memory device will be described below.

FIG. 14 is a configuration view of a semiconductor memory device (SRAM) of a first conventional example. The semiconductor memory device in FIG. 14 has memory cells 1, word-line drivers 2, a redundant word-line driver 3, a bit-line precharge control signal line driver 4, bit-line precharge circuits 5, word lines WL1 and WL2, a redundant word-line RWL, pairs of bit lines BL1, /BL1 and BL2, /BL2, and a bit-line precharge control signal line PCGL.

WLCG1 to WLCG 3 and PCG designate a word-line control signal and a bit-line precharge control signal, respectively, and "A" indicates a break in the word line.

The word-line drivers 2 are buffers connected to the respective word lines WL1 and WL2 and transmit the respective word-line control signals WLCG1 and WLCG2 to be inputted to memory cells 1 respectively through the respective word lines WL1 and WL2.

The redundant word-line driver 3 is a buffer connected to the redundant word-line RWL, and in the case where a defect exists in the word lines WL1 and WL2 and so on, the driver 3 transmits the word-line control signal WLCG3 to be inputted to memory cells 1 respectively through the redundant word-line RWL.

The bit-line precharge control signal line driver 4 is a buffer connected to the bit-line precharge control signal line PCGL, outputs the inputted bit-line precharge control signal PCG to the bit-line precharge control signal line PCGL and activates or deactivates the bit-line precharge circuits 5.

Each memory cell 1 is connected to a word line (including a redundant word line) and a pair of bit lines.

FIG. 15 is a circuit diagram showing the specific configuration of the memory cell 1. In FIG. 15, Q1 and Q2 are access transistors, Q3 and Q4 are drive transistors, Q5 and Q6 are load transistors, WL is a word line, BL and /BL are a pair of bit lines, and VDD is a power source terminal.

The gate terminals of the access transistors Q1 and Q2 are connected to the word line WL or the redundant word line RWL and drain terminals thereof are connected to the pair of bit lines BL and /BL, respectively.

The drive transistor Q3 and the load transistor Q5 form a first inverter and the drive transistor Q4 and the load transistor Q6 form a second inverter.

An output terminal of the first inverter is connected to an input terminal of the second inverter and an output terminal of the second inverter is connected to an input terminal of the first inverter so that a latch circuit is constituted. The latch circuit stores and holds data. When the word line WL or RWL (including the redundant word line) becomes H level, the memory cell 1 connected to the line outputs data stored therein to the pair of bit lines BL and /BL or receives input of a complementary signal (data) transmitted through the pair of bit lines BL and /BL.

FIG. 16 is a circuit diagram showing the specific configuration of the bit-line precharge circuit 5. In FIG. 16, Q7 and Q8 are precharge transistors, Q9 is an equalize transistor, BL and /BL are a pair of bit lines, PCGL is a bit-line precharge control signal line, and VDD is a power source terminal.

Each gate terminal of the precharge transistors Q7, Q8 and the equalize transistor Q9 is connected to the bit-line precharge control signal line. The drain terminals of the precharge transistors Q7 and Q8 are connected to the pair of bit lines BL and /BL, respectively and the source terminals are connected to the power source terminal VDD. The source terminal and drain terminal of the equalize transistor Q9 are connected to the pair of bit lines BL and /BL, respectively.

When the bit-line precharge control signal PCG is L level, the bit-line precharge circuits 5 become activated and precharge pairs of bit lines BL1, /BL and BL2, /BL2. When the bit-line precharge control signal PCG is H level, the bit-line precharge circuits 5 become deactivated and go into a high impedance state.

Operations of the semiconductor memory device thus constituted will be described below. Firstly, the case where no break A occurs in the word line will be explained.

When all of the word-line drivers 2 and the redundant word-line driver 3 output the word-line control signals WLCG1 to WLCG3 of L level, all memory cells 1 go into a high impedance state (the state in which data input/output is not performed). At that time, the bit-line precharge control signal PCG (output signal of the bit-line precharge control signal line driver 4) becomes L level and the bit-line precharge circuits 5 go into an activated state. All pairs of bit lines BL and /BL are precharged to H level (VDD level) by the bit-line precharge circuits 5.

Next, when the bit-line precharge control signal PCG becomes H level, the bit-line precharge circuits 5 go into a deactivated state (a high-impedance state).

When any one of all of the word-line drivers 2 and the redundant word-line driver 3 outputs H level, the memory cells 1 to which H level is inputted through the word line WL or RWL become activated (writing or reading of data is carried out). In the memory cell 1 which receives input of the word-line control signal WLCG of H level, gates of the access transistors Q1 and Q2 turns ON and writing or reading data to/from the latch circuits Q3 to Q6 is performed through the pair of bit lines BL and /BL connected to the access transistors Q1 and Q2, respectively.

When writing or reading data to/from the memory cells 1 is completed, the word-line control signal WLCG returns to L level from H level and the memory cells 1 go into a high impedance state. The bit-line precharge control signal PCG becomes L level again and the bit-line precharge circuits 5 are activated, so that the pairs of bit lines BL and /BL are precharged to H level. Subsequently, the above-mentioned processing is repeated.

Next, the case where a break A occurs in the word line will be described.

Suppose that a break occurs at the point indicated as A in FIG. 14. Even if the word-line driver 2 transmits the word-line control signal of H level through the word line WL1 with a break, it is impossible to properly write and read data to/from the memory cell connected to the word line WL1 on the right side from the break A.

In such a case, by performing redundancy relief mainly according to the below-mentioned method, a non-defective semiconductor memory device is completed. The word line WL1 with a break is made to L level (the input terminal of the word line driver 2 connected to the word line WL1 is connected to ground) and all memory cells 1 connected to the word line WL1 are made to be in a high impedance state. The word-line control signal WLCG inputted to the word line driver 2 connected to the word line WL1 is inputted to the redundant word-line driver 3. The redundant word-line driver 3 transmits the word-line control signal WLCG to the memory cells 1 through the redundant word line RWL, whereby that writing or reading data is performed in the memory cells 1 connected to the redundant word line RWL. By replacing the memory cells connected to the word line WL1 having a break with the memory cells connected to the redundant word line RWL, the semiconductor memory device can perform proper writing and reading of data.

However, the above-mentioned conventional configuration has problems as stated below.

In FIG. 14, even if an input terminal of the word-line driver 2 connected to the word line WL1 with a break is connected to ground, the word line WL1 remains in a floating state on the right side from the break point A at all times. In the case where the potential of the word line WL1 in a floating state equals the gate threshold of the access transistors Q1 and Q2 of the memory cell 1 or greater, all memory cells 1 connected to the word line on the right side from the break point A are always in an activated state (the state in which writing or reading of data is performed at all times).

Even if the memory cells connected to the word line WL1 with a break are replaced with memory cells connected to the redundant word line RWL, there is a possibility that the memory cells 1 connected to the word line in a floating state remain activated in the memory cell array. In the case where normal word lines other than the word line WL1 with a break (the word line WL2 or the redundant word line RWL in FIG. 14) become H level, data conflict between the memory cell 1 which is connected to the word line in a floating state and remains activated at all times and the memory cells 1 which are connected to the normal word lines and become activated may occur through the pair of bit lines (BL2 and /BL2 in FIG. 14), resulting in damaging data of memory cells 1 connected to the normal word lines.

In the period during which the bit-line precharge control signal PCG becomes L level and the pairs of bit lines are precharged to H level, the problem arises that pass-through current flows between the memory cell connected to the word line in a floating state and the bit-line precharge circuit. The above-mentioned problem arises when a break occurs in the word lines, and also when a break occurs in the redundant word line.

A semiconductor memory device described in Unexamined Patent Publication No. 11-213690 as a conventional example has means for dealing with the problem.

The semiconductor memory device described in Unexamined Patent Publication No. 11-213690 will be described referring to its figures and specification partly. FIG. 17 is a configuration view of a semiconductor memory device of a second conventional example.

FIG. 17 shows a memory cell array 30, a spare memory cell array 31, a row decoder 32, a spare row decoder 33, a column decoder 34, an input/output circuit 35, a pulldown circuit 36, static memory cells 20, spare static memory cells 21, NOR circuits 22, a pair of input/output lines 23, column selecting gates 24, a ground node 25, a break point 26 and parasitic capacitors between word lines 27.

The pulldown circuit 36 includes a plurality of N-type MOS transistors Q1 to Qm to pull down the potential of a plurality of word lines WL1 to WLm in the memory cell array 30 to ground potential. The plurality of N-type MOS transistors Q1 to Qm are provided corresponding to the plurality of word lines WL1 to WLm, respectively. Each of the N-type MOS transistors Q1 to Qm is connected between the terminal of the corresponding word line and the ground node 25 and turns ON in response to a spare enable signal NED of H level sent from a program circuit (not shown in FIG. 17).

The program circuit can program an address corresponding to a defective word line of the plurality of word lines WL1 to WLm. When a row address signal sent from an address buffer (not shown in FIG. 17) to the row decoder 32 indicates the programmed address, the program circuit generates the spare enable signal NED of H level. In response to the spare enable signal NED of H level, the spare row decoder 33 is activated and the row decoder 32 is deactivated.

Moreover, in response to the spare enable signal NED of H level, all of the N-type MOS transistors Q1 to Qm in the pulldown circuit 36 turn ON and all of the word lines WL1 to WLm in the memory cell array 30 are connected to the ground node 25.

In the case where the word line activated by the row address signal sent from the address buffer to the row decoder 32 is not a defective word line, the spare enable signal NED becomes L level. When the spare enable signal NED becomes L level, the static memory cells 20 connected to the word line of H level are brought into conduction (normal operation is carried out).

In FIG. 17, there exists the break 26 in the word line WL2 (corresponding to row address 2). The program circuit is set so that the spare enable signal NED becomes H level when the row address 2 is input. For example, when the spare word line SWL1 becomes H level at the row address 2, the defective word line WL2 is electrically replaced with the spare word line SWL1.

In the semiconductor memory device of the second conventional example, when the spare word line SWL1 as a substitute for the word line WL2 is activated to be H level, the terminal of the word line WL2 is connected to the ground node 25 through the N-type MOS transistor Q2. Accordingly, the potential of the part remote from the row decoder 32 of the world line WL2 (word line WL2 on the right side from the break point 26 in FIG. 17) is pulled down to the ground potential. Thus, when the spare word line SWL1 is activated, the word line WL2 never becomes activated, that is, no multi-selection occurs. As a result, correct data can be read out from the spare static memory cells 21 connected to the spare word line SWL1.

In the semiconductor memory device of the second conventional example, when the spare word line is activated, the potential of the word lines WL1 to WLm in the memory cell array 30 is pulled down by the N-type MOS transistors Q1 to Qm. This prevents the word line WLi ($1 \leq i \leq m$) replaced with the spare word line SWLj ($1 \leq j \leq p$) from going into a floating state and also prevents multi-selection of selecting the spare word line SWLj and the replaced word line WLi simultaneously from occurring.

With the above configuration, however, all of the pulldown transistors Q1 to Qm are in a deactivated state when a word line other than the redundant word line (for example, WL3) is selected. In the case where the potential of the word line WL2 with a break becomes a threshold of the memory cell or greater due to external effect (such as noise generated by coupling capacitor with other signal line), a similar problem in the above-mentioned conventional example can occur (multi-selection of selecting the word lines WL2 and WL3 simultaneously can occur). As wiring capacitor of the spare enable signal and gate capacitors of all pull-down transistors Q1 to Qm connected to the spare enable signal are charged or discharged according to selection or non-selection of the redundant word line, power consumption increases.

The present invention intends to solve the above-mentioned conventional problems and to provide a semiconductor memory device that ensures redundancy relief in the word line with a break at lower power consumption.

In the conventional semiconductor memory device, in the period during which the pairs of bit lines are precharged, the problem arises that pass-through current flows between the memory cells connected to the word line with a break and the bit-line precharge circuits. According to the present invention, in the period during which the pairs of bit lines are precharged, no pass-through current flows between the memory cells connected to the word line with a break and the bit-line precharge circuits and a semiconductor memory device that ensures redundancy relief in the word line with a break at lower power consumption is thus provided.

BRIEF SUMMARY OF THE INVENTION

To solve the above-mentioned problems, the present invention has the following configuration. A semiconductor memory apparatus from one aspect of the present invention comprises a plurality of word lines including one or more redundant word lines; a plurality of pairs of bit lines; a plurality of memory cells connected to the above-mentioned plurality of word lines and the above-mentioned plurality of pairs of bit lines; a plurality of word-line drivers, each of which is connected to respective one ends of the above-mentioned plurality of word lines and controlled by a plurality of word-line control signals; and a plurality of first word-line control circuits respectively located at the other ends of the above-mentioned plurality of word lines, each of the above-mentioned plurality of first word-line control circuits receiving a signal level of a corresponding one of the above-mentioned plurality of word lines, wherein, in the case where the signal level of the above-mentioned corresponding word line is a first level at which corresponding ones of the above-mentioned plurality of memory cells connected to the above-mentioned corresponding word line go into a high impedance state, each of the above-mentioned plurality of first word-line control circuits switches to a conducting state and outputs a signal of the above-mentioned first level to the above-mentioned corresponding word line, and in the case where the signal level of the above-mentioned corresponding word line is a second level at which the above-mentioned corresponding memory cells go into a state wherein data input/output is performed, each of the above-mentioned plurality of first word-line control circuits switches to a non-conducting state.

With the above-mentioned configuration, in the case where a break occurs in the word lines, the semiconductor memory apparatus of the present invention can prevent the word line with a break from going into a floating state by connecting the word-line control circuit controlled by the word line itself to distal ends of all word lines including the redundant word line (the end opposite to the connecting end with the word-line driver, that is the other end). Thus, It can be prevented that collision between data of the memory cells connected to the word line with a break and data of normal memory cells occurs through the pairs of bit lines, and that pass-through current flows between the memory cells connected to the word line with a break and the bit-line precharge circuits in the period during which the pairs of bit lines are precharged. The present invention realizes the semiconductor memory device capable of performing redundancy relief of a break in the word line reliably.

In the conventional semiconductor memory devices, the word line with a break goes into a floating state in the period during which the word lines are activated. Since the word line with a break does not go into a floating state in the semiconductor memory device of the present invention, more reliable redundancy relief is possible.

In the pulldown circuit of the conventional semiconductor memory devices, as wiring capacitor of spare enable signal and gate capacitors of all pulldown transistors connected to the spare enable signal are charged or discharged according to selection or non-selection of the redundant word line, power consumption is considerable. Since the word-line control circuit of the semiconductor memory device according to the present invention is constituted so as to be controlled by the word line itself, there is no need to constitute the circuit while taking account of operation timing of the word line and other signal, resulting in lower power consumption.

A semiconductor memory apparatus from another aspect of the present invention further comprises a plurality of second word-line control circuits respectively located at points other than both ends of the above-mentioned plurality of word lines, each of the above-mentioned plurality of second word-line control circuits receiving a signal level of a corresponding one of the above-mentioned plurality of word lines, wherein, in the case where the signal level of the above-mentioned corresponding word line is a first level at which corresponding ones of the above-mentioned plurality of memory cells connected to the above-mentioned corresponding word line go into a high impedance state, each of the above-mentioned plurality of second word-line control circuits switches to a conducting state and outputs a signal of the above-mentioned first level to the above-mentioned corresponding word line, and in the case where the signal level of the above-mentioned corresponding word line is a second level at which the above-mentioned corresponding memory cells go into a state wherein data input/output is performed, each of the above-mentioned plurality of second word-line control circuits switches to a non-conducting state.

The semiconductor memory apparatus of the present invention can prevent the word line with multiple breaks from going into a floating state by connecting the word-line control circuit controlled by the word line itself to distal ends of all word lines including the redundant word line (the end opposite to the connecting end with the word-line driver, that is the other end) and one or more points other than both ends. Thus, It can be prevented that collision between data of the memory cells connected to the word line with a break and data of normal memory cells occurs through the pairs of bit lines, and that pass-through current flows between the memory cells connected to the word line with a break and the bit-line precharge circuits in the period during which the pairs of bit lines are precharged. As a result, it is possible to perform redundancy relief of a break in the word line of the semiconductor memory device at a higher probability.

In the conventional semiconductor memory devices, the word line with a break goes into a floating state in the period during which the word lines are activated. Since the word line with a break does not go into a floating state in the semiconductor memory device of the present invention, more reliable redundancy relief is possible.

In the pulldown circuit of the conventional semiconductor memory devices, as wiring capacitor of spare enable signal and gate capacitors of all pull-down transistors connected to the spare enable signal are charged or discharged according to selection or non-selection of the redundant word line, power consumption is considerable. Since the word-line control circuit of the semiconductor memory device according to the present invention is constituted so as to be controlled by the word line itself, there is no need to constitute the circuit while taking account of operation timing of the word line and other signal, resulting in lower power consumption.

Furthermore, in a semiconductor memory apparatus from another aspect of the present invention, each of the above-mentioned first word-line control circuits comprises an inverter element that receives input of the signal level of the above-mentioned word line; and a first word-line control element, coupled to the above-mentioned corresponding word line, that receives an output signal of the above-mentioned inverter element.

With the circuit configuration of lower cost and smaller area, the present invention realizes the semiconductor memory device in which one word line with a break is prevented from going into a floating state.

Furthermore, in a semiconductor memory apparatus from another aspect of the present invention, each of the above-mentioned first word-line control circuits further comprises a second word-line control element that switches to a conducting state and outputs the above-mentioned first level of signal to the above-mentioned corresponding word line when a word-line initializing signal inputted at an initialization is inputted, and switches to a non-conducting state when the above-mentioned word-line initializing signal is not inputted.

The present invention can realize the semiconductor memory device in which the part of the word line with a break, which cannot be controlled by the word-line driver, is reliably maintained at a deactivated state (the state in which memory cells connected thereto are not conductive).

Furthermore, in a semiconductor memory apparatus from another aspect of the present invention, each of the above-mentioned plurality of first word-line control elements is formed of a MOS transistor having an inverse narrow width effect.

By using the MOS transistor having an inverse narrow width effect as the word-line control element, the semiconductor memory device in which the word-line control circuit connected to the word line with a break is operated reliably (the word line is maintained at a deactivated state certainly) at the time of startup and so on, can be realized.

Furthermore, in a semiconductor memory apparatus from another aspect of the present invention, each of the above-mentioned plurality of first word-line control circuits comprises: a logical circuit that receives inputs of a redundant selection signal indicating whether redundancy relief is performed or not and the signal level of the above-mentioned corresponding word line; and a first word-line control element, coupled to the above-mentioned corresponding word-line, that receives an output signal of the above-mentioned logical circuit, wherein, in the case where the above-mentioned redundant selection signal indicates that redundancy relief is performed and the signal level of the above-mentioned corresponding word line is the above-mentioned first level, the above-mentioned first word-line control element switches to a conducting state and outputs a signal of the above-mentioned first level to the above-mentioned corresponding word line, and in the case where the above-mentioned redundant selection signal indicates that redundancy relief is not performed or the signal level of the above-mentioned corresponding word line is the above-mentioned second level, the above-mentioned first word-line control element switches to a non-conducting state.

In the semiconductor memory apparatus of the present invention, in the case where no break occurs in the word lines (redundancy relief is not performed), the word-line control circuit suspends its operation. This enables lower power consumption of the semiconductor memory device.

Furthermore, in a semiconductor memory apparatus from another aspect of the present invention, each of the above-mentioned plurality of first word-line control circuits comprises a word-line transfer element, controlled by a redundant selection signal indicating whether redundancy relief is performed or not, between the above-mentioned corresponding word line and an input/output-terminal for receiving the signal level of the above-mentioned corresponding word line and outputting an output signal to the above-mentioned corresponding word line, wherein, in the case where the above-mentioned redundant selection signal indicates that redundancy relief is performed, the above-mentioned word-line transfer element switches to a conducting state and connects the above-mentioned input/output terminal to the above-mentioned corresponding word line, and in the case where the above-mentioned redundant selection signal indicates that redundancy relief is not performed, the above-mentioned word-line transfer element disconnects the above-mentioned input/output terminal from the above-mentioned corresponding word line.

In the semiconductor memory device of the present invention, the word-line transfer element controlled by the redundant selection signal is inserted into the word-line control circuit, and in the case where no break occurs in the word-line (redundancy relief is not performed), the word-line control circuit suspends its operation. This enables lower power consumption of the semiconductor memory device.

Furthermore, in a semiconductor memory apparatus from another aspect of the present invention, the above-mentioned plurality of first word-line control circuits are formed by using elements of dummy memory cells located around a memory cell array comprising the above-mentioned plurality of memory cells.

In the semiconductor memory device of the present invention, the word-line control circuits are formed by using elements of the dummy memory cells. Increase in the layout area of the semiconductor memory device can be suppressed. Preferably, by changing only wiring layer without modifying the pattern of the semiconductor substrate, the word-line control circuits are constituted by using elements of the dummy memory cell. This doesn't destabilize processing shape of the memory cell array.

In a semiconductor memory apparatus from another aspect of the present invention, current driving capacity of the above-mentioned first word-line control element is smaller than current driving capacity of a corresponding one of the above-mentioned word-line drivers.

With this configuration, the semiconductor memory device that ensures redundancy relief in the word line with a break and operates stably at lower power consumption can be realized.

The novel features of the invention are set forth with particularity in the appended claims. The invention as to both structure and content, and other objects and features thereof will best be understood from the detailed description when considered in connection with the accompanying drawings.

BRIEF DESCRIPTION OF DRAWINGS

FIG. 1 is a configuration view of a semiconductor memory device of a first embodiment according to the present invention.

FIG. 2 is a configuration view of a semiconductor memory device of a second embodiment according to the present invention.

FIG. 6 is an example of a specific circuit configuration in which a word-line control circuit is configured by using a dummy memory cell of the semiconductor memory device of the fifth embodiment according to the present invention.

FIG. 7 is an example of a specific circuit configuration in which a word-line control circuit is configured by using a dummy memory cell of the semiconductor memory device of the fifth embodiment according to the present invention.

Figure 3:
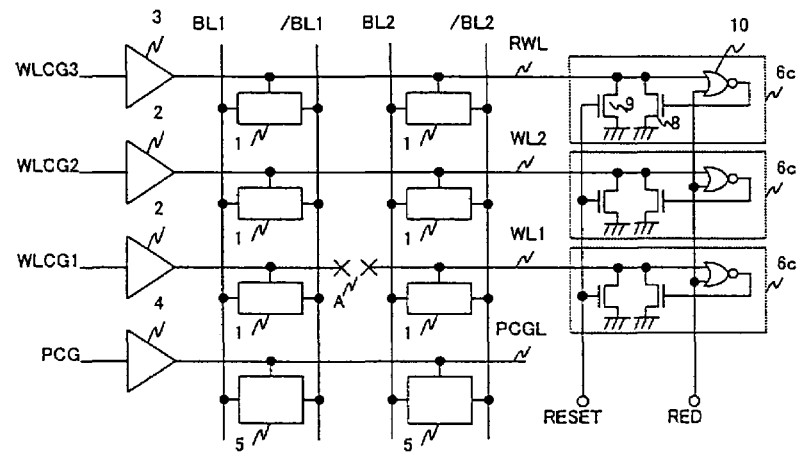
FIG. 3 is a configuration view of a semiconductor memory device of a third embodiment according to the present invention.

Part or All of the drawings are drawn schematically for diagrammatic representation and it should be considered that they do not necessarily reflect relative size and position of components shown therein.

DETAILED DESCRIPTION OF THE INVENTION

Embodiments that specifically describe best modes for conducting the present invention will be described referring to figures below.

Embodiment 1

FIG. 1 shows a configuration view of a semiconductor memory device (SRAM) of a first embodiment according to the present invention.

The semiconductor memory device shown in FIG. 1 has memory cells 1, word-line drivers 2, a redundant word-line driver 3, a bit-line precharge control signal line driver 4, bit-line precharge circuits 5, word-line control circuits 6a, word lines WL1 and WL2, a redundant word-line RWL, pairs of bit lines BL1, /BL1 and BL2, /BL2, and a bit-line precharge control signal line PCGL. The word-line control circuit 6a has an inverter element 7 and a word-line control element 8.

WLCG1 to WLCG 3 and PCG designate a word-line control signal and a bit-line precharge control signal, respectively, and "A" indicates a break in the word line.

The word-line drivers 2 are buffers connected to one ends of the respective word lines WL1, WL2 and transmit the respective word-line control signals WLCG1, WLCG2 to be inputted to respective memory cells 1 through the respective word line WL1, WL2.

The redundant word-line driver 3 is a buffer connected to one end of the redundant word-line RWL and transmits the word-line control signal WLCG3 to be inputted to respective memory cells 1 through the redundant word-line RWL.

The bit-line precharge control signal line driver 4 is a buffer connected to the bit-line precharge control signal line PCGL, outputs the inputted bit-line precharge control signal PCG to the bit-line precharge control signal line PCGL and activates or deactivates the bit-line precharge circuits 5. Each memory cell 1 is connected to one of the word lines WL and RWL (including a redundant word line) and a pair of bit lines.

The word-line control circuits 6a are respectively connected to the other ends of all of the word lines WL1, WL2 and RWL including redundant word-line (the end opposite to one end of each of the word lines and so on connected to the word-line drivers 2 and the redundant word-line driver 3, that is, distal end). Each word-line control circuit 6a comprises the inverter element 7 and the word-line control element 8 (an N-type MOS transistor in the first embodiment). The inverter element 7 receives input of a signal from the word lines WL1, WL2 or RWL and outputs an inverted signal level. The word-line control element 8 receives the output signal of the inverter element 7 at gate terminal thereof. The drain terminal of the word-line control element 8 is connected to the word lines WL1, WL2 or RWL and source terminal thereof is connected to ground. The word-line control element 8 has a smaller driving capacity than the word-line driver 2 and the redundant word-line driver 3.

Figure 15:
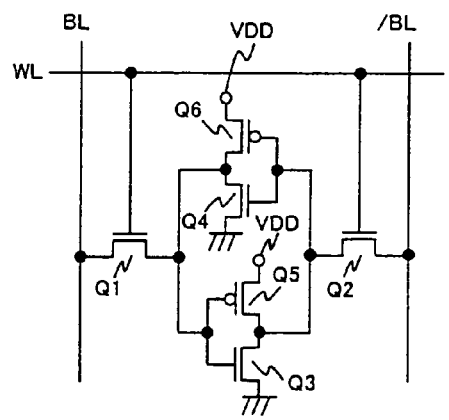
FIG. 15 is a specific circuit configuration of a memory cell.
Figure 16:
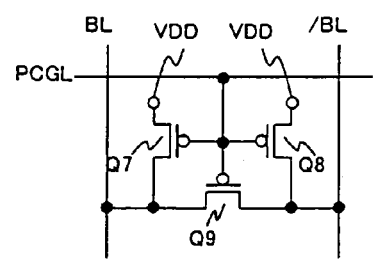
FIG. 16 is a specific circuit configuration of a bit-line precharge circuit.
Figure 17:
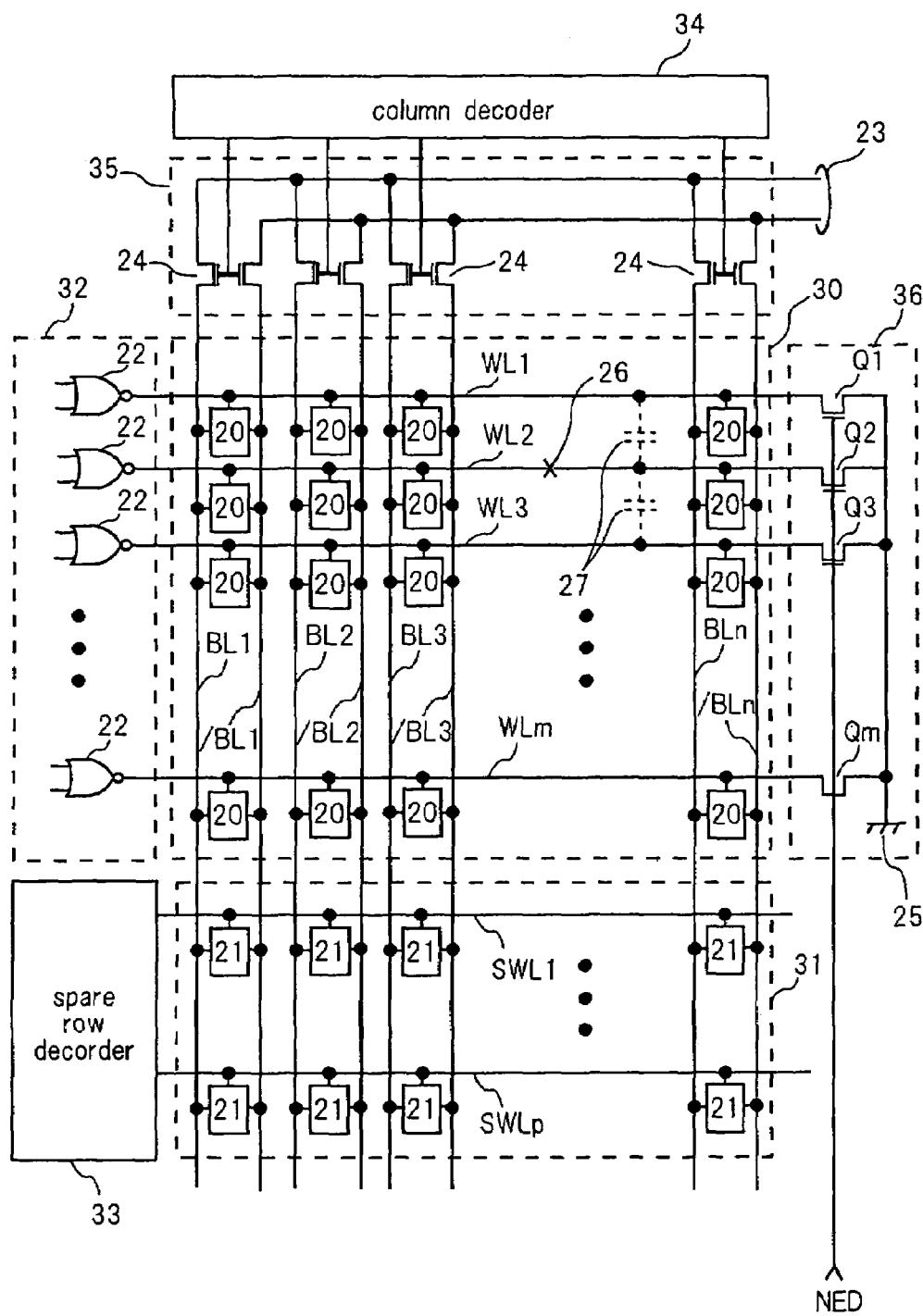
FIG. 17 is a configuration view of a semiconductor device of a second conventional example.

FIG. 15 is a circuit diagram showing the specific configuration of the memory cell 1, and FIG. 16 shows a diagram showing the specific configuration of the bit-line precharge circuit 5. The configuration is the same as that of the conventional examples and therefore description thereof is omitted.

Operations of the semiconductor memory device of this embodiment thus constituted as mentioned above will be described below.

Firstly, the case where no break occurs in the word lines will be explained.

When all of the word-line drivers 2 and the redundant word-line driver 3 output the word-line control signals WLCG1 to WLCG3 of L level, the word lines WL1, WL2 and the redundant word-line RWL become L level and an output signal of each inverter element 7 connected to them becomes H level. The word-line control element 8 that receives the output signal (H level) of the inverter element 7 at gate terminal thereof goes into an activated state (conducting state). The word lines WL1, WL2 and the redundant word-line RWL become GND level (L level).

Accordingly, the operation of the word-line control circuit 6a has no influence on the output signals of the word-line drivers 2 and the redundant word-line driver 3. As a result, all memory cells 1 go into a high impedance state (the state in which data input/output is not performed).

Next, the bit-line precharge control signal PCG (output signal of the bit-line precharge control signal line driver 4) becomes L level and the bit-line precharge circuits 5 go into an activated state. All pairs of bit lines BL and /BL are precharged to H level (VDD level) by the bit-line precharge circuits 5.

Next, when the bit-line precharge control signal PCG becomes H level, all bit-line precharge circuits 5 go into a deactivated state (high-impedance state). When any one of all word-line drivers 2 and the redundant word-line driver 3 outputs H level, the memory cells 1 that receive input of H level through the word line WL or RWL (including the redundant word line) become activated (writing or reading of data is performed).

At this time, in the word-line control circuit 6a connected to one of the word lines WL and the redundant word line RWL of H level, the output signal of the inverter element 7 to which H level is inputted becomes L level and the word-line control element 8 that receives the output signal (L level) of the inverter element 7 at gate terminal thereof goes into a deactivated state (blocking state). The word-line control element 8 has no influence on H level of the word line WL or RWL. Therefore, the word-line control circuit 6a does not interfere writing or reading data performed by the activated memory cells 1 through the word line WL or RWL. In the memory cell 1 which receives input of the word-line control signal WLCG of H level, the gates of the access transistors Q1 and Q2 turn ON and writing or reading data to/from the latch circuits Q3 to Q6 is performed through the pair of bit lines BL and /BL connected to the access transistors Q1 and Q2, respectively.

When writing or reading data to/from the memory cells 1 is completed, the word-line control signal returns to L level from H level and all memory cells 1 go into a deactivated state (high-impedance state). At this time, in the word-line control circuit 6a, the word lines WL1, WL2 and the redundant word line RWL are L level and thus the output signal of the inverter element 7 becomes H level. The word-line control element 8 that receives the output signal (H level) of the inverter element 7 at gate terminal thereof goes into a deactivated state (conducting state). The word lines WL1, WL2 and the redundant word line RWL become L level. Therefore, the operation of the word-line control circuits 6a have no influence on the output signals of the word-line drivers 2 and the redundant word-line driver 3. Again, the bit-line precharge control signal PCG becomes L level, the bit-line precharge circuits 5 are activated and all of the pairs of bit lines BL, /BL are precharged to H level (VDD level). Subsequently, the above-mentioned processing is repeated.

As described above, in the case of no break in the word lines, the operation of the semiconductor memory device of this embodiment are substantially the same as that of the conventional example.

The case in which a break A occurs in a word line will be described. The word line with the break A (WL1 in FIG. 1) is replaced with the redundant word line RWL by redundancy relief. The word line WL1 with the break A is made to be L level (the input terminal of the word-line driver 2 connected to the word line WL1 is connected to ground) so that the memory cells 1 connected to the word line WL1 go into a deactivated state (high-impedance state).

When all of the word-line drivers 2 and the redundant word-line driver 3 output the word-line control signals WLCG 1 to WLCG3 of L level, all memory cells 1 go into a high-impedance state (the state in which no data input/output is performed). Next, the bit-line precharge control signal PCG (output signal of the bit-line precharge control signal line driver 4) becomes L level and the bit-line precharge circuits 5 go into an activated state. All pairs of bit lines BL and /BL are precharged to H level (VDD level) by the bit-line precharge circuits 5.

Next, when the bit-line precharge control signal PCG becomes H level, all bit-line precharge circuits 5 go into a deactivated state (high impedance state). When either one of the word-line driver 2 or 3 of all word-line drivers 2 and the redundant word-line driver 3 outputs H level, the memory cells 1 that receive input of H level through the word line WL or RWL (including the redundant word line) become activated (writing or reading of data is performed). In the memory cells 1 to which the word-line control signal of H level is inputted, writing or reading of data is performed through the pair of bit lines BL, /BL.

The word line WL or RWL with no break (in FIG. 1, except for the part of the word line WL1 on the right side from the break point A) performs the same operation as in the above-mentioned case of no break in the word line. The operation of the word-line control circuits 6a have no influence on output signals from the word-line drivers 2 and the redundant word-line driver 3.

Without the word-line control circuit 6a in the word line WL1 with a break, the part of the word line WL1 on the right side from the break point A goes into a floating state. According to the present invention, the word-line control circuit 6a latches the part of the word line WL1 on the right side from the break point A at L level. Accordingly, the part of the word line WL1 on the right side from the break point A never goes into a floating state. Until immediately before turning on the power, all nodes of the word-line control circuit 6a is in L level. After turning on the power, the output signal of the inverter element 7 that receives input of L level becomes H level. The word-line control element 8 that receives the output signal of the inverter element 7 at gate terminal thereof goes into an activated state (conducting state) by the output signal (H level) of the inverter element 7. The word-line control element 8 is stabilized in a conducting state. The word-line control circuit 6a latches the part of the word line WL1 on the right side from the break point A at L level.

If a MOS transistor having an inverse narrow width effect (the phenomenon in which width size of a MOS transistor becomes very small due to process miniaturization, thereby to lower threshold voltage of the MOS transistor and increase drain current per unit length of width size of the MOS transistor. As threshold voltage of the MOS transistor is lowered, off-leak current increases. According to measured data, this phenomenon becomes more pronounced in a MOS transistor having width size of about 0.25 μm or less by using 0.10 μm process technology.) is used as the word-line control element 8, after turning on the power, the node on the right side from the break point A in the word line WL1 can be set at L level more reliably by the off-leak current of the MOS transistor.

According to the present invention, even if the break A occurs in the word line WL1, only the access transistors Q 1 and Q2 of the memory cell 1 connected to any other word line of H level turn ON, and writing or reading data to/from the latch circuit Q3 to Q6 is performed through the pair of bit lines BL and /BL connected to the access transistors Q1 and Q2, respectively (the memory cell 1 is activated).

When writing or reading data to/from the memory cell 1 is completed, the word-line control signal returns to L level from H level and all of the memory cells 1 go into a deactivated state (high-impedance state). The bit-line precharge control signal PCG becomes L level again and the bit-line precharge circuits 5 are activated, so that all pairs of bit lines BL and /BL are precharged to H level (VDD level). At this time, the word line WL or RWL with no break (in FIG. 1, except for the part of the word line WL1 on the right side from the break point A) performs the same operation as in the above-mentioned case of no break in the word line. The operation of the word-line control circuits 6a have no influence on output signals from the word-line drivers 2 and the redundant word-line driver 3. Since the word-line control circuits 6a latches the part of the word line WL1 on the right side from the break point A at L level at all times, the part of the word line WL1 on the right side from the break point A never goes to a floating state.

For the reliable relief of a break in the word line, the word-line control circuit 6a is connected to all word lines including the redundant word line at the remotest point from one end of the respective word line connected to the word-line driver 2 or the redundant word-line driver 3 (distal end or other end of the word line et al.). Unless the word-line control circuit 6a is connected to the distal end of the word line or the redundant word line, in the case where a break occurs in the word line between the connecting point with the word-line control circuit 6a and the distal end of the word line or the redundant word line, it is impossible to relieve the semiconductor memory device.

In the semiconductor memory device shown in FIG. 1, in the case of configuration where the memory cells are activated when the word line or the redundant word line is in L level, it is needless to say that the same effect can be obtained by replacing the word-line control element 8 comprised of the word-line control circuit 6a with a P-type MOS transistor and connecting the source terminal of the transistor to VDD.

For facilitating the explanation of concept of the present invention, although the semiconductor memory device in FIG. 1 consists of small number of memory cell, word-line driver, redundant word-line driver, word line, redundant word line, pair of bit-lines, word line control circuit and so on, the number of each element may be plural (or numerous) and of course, there causes no change in effect.

As described above, in the case where a break occurs in the word lines, the word line with a break can be prevented from going into a floating state by connecting the word-line control circuit to the distal ends (remotest point from the connecting end of the word-line driver) of all word lines including the redundant word line. Whereby, it can be avoided that data conflict between the memory cell connected to the word line with a break and the memory cell connected to the normal word line occurs via the pair of bit lines, and that pass-through current flows between the memory cell connected to the word line with a break and the bit-line precharge circuit in the period during which the pair of bit lines are precharged. Thus, defect of word line due to break can be relieved at a higher probability. Moreover, in contrast to the conventional examples, since the semiconductor memory device is configured so that the word line with a break never goes into a floating state in the period during which the word line is activated, redundancy relief can be conducted more reliably. Furthermore, since the word-line control circuit is constituted so that it is controlled by the word line itself, there is no need to constitute the circuit while taking account of operation timing of the word line and other signal, resulting in lower power consumption. Furthermore, by using the MOS transistor having an inverse narrow width effect as the word-line control element, the word-line control circuit connected to the word line with a break can be operated at the time of startup and so on.

Embodiment 2

FIG. 2 shows a configuration view of a semiconductor memory device (SRAM) of a second embodiment according to the present invention.

The semiconductor memory device shown in FIG. 2 has memory cells 1, word-line drivers 2, a redundant word-line driver 3, a bit-line precharge control signal line driver 4, bit-line precharge circuits 5, word-line control circuits 6b, word lines WL1 and WL2, a redundant word-line RWL, pairs of bit lines BL1, /BL1 and BL2, /BL2, and a bit-line precharge control signal line PCGL. The word-line control circuit 6b has an inverter element 7 and word-line control elements 8, 9.

WLCG1 to WLCG 3, PCG and RESET designate a word-line control signal, a bit-line precharge control signal, and a word-line initializing signal, respectively. "A" indicates a break in the word line.

FIG. 15 is a circuit diagram showing the specific configuration of the memory cell 1, and FIG. 16 shows a diagram showing the specific configuration of the bit-line precharge circuit 5. The configuration is the same as that of the conventional example and therefore description thereof is omitted.

The word-line control circuit 6b is connected to the other ends of all of the word lines WL1, WL2 and the redundant word-line RWL (the end opposite to one end of each of the word lines and so on connected to the word-line drivers 2 and the redundant word-line driver 3, that is, distal end).

The word-line control circuit 6b of semiconductor memory device of this embodiment has a configuration in which the word-line control element 9 (an N-type transistor in this embodiment) is added to the components of the word-line control circuit 6a of the semiconductor memory device of the first embodiment shown in FIG. 1.

The drain terminal of the word-line control element 9 is connected to the word lines WL1, WL2 or RWL, source terminal thereof is connected to ground and gate terminal thereof is controlled by the word-line initializing signal RESET. The word-line control element 9 has a smaller current driving capacity than the word-line driver 2 and the redundant word-line driver 3.

Operations of the semiconductor memory device of this embodiment thus constituted as mentioned above will be described below.

When the word-line initializing signal RESET is at L level, all of the word-line control elements 9 controlled by the word-line initializing signal RESET go into a deactivated state and therefore it is obvious to perform the same operations as in the first embodiment.

In this embodiment, the word-line initializing signal RESET is made to be at H level at least once during the period between turn-on of the power and start of normal operation (the state in which writing or reading data to/from is performed), thereby to activate the word-line control elements 9 so that the part of the word line WL1 with a break on the right side from the break point A is ensured to become L level.

The part of the word line WL1 with a break on the right side from the break point A is made to become L level through the word-line control element 9 during the period from turn-on of the power to normal operation. As described in the first embodiment, this allows the part to be stably latched at L level at all times. Thus, the part of the word line WL1 on the right side from the break point A never goes into a floating state.

The word-line initializing signal RESET may be generated within the semiconductor memory device (SRAM). Alternatively, it may be a signal inputted from any device other than the semiconductor memory device (SRAM).

As described in the first embodiment, for the reliable relief of a break in the word lines, the word-line control circuit 6b is connected to all of the word lines including the redundant word line at the remotest point from one end of the respective word line connected to the word-line drivers 2 and the redundant word-line driver 3 (distal end or the other end of the word line et al).

In the semiconductor memory device shown in FIG. 2, in the configuration in which memory cells are activated when the word line or the redundant word line is at L level, the word-line control elements 8, 9 forming the word-line control circuit 6b are replaced with P-type MOS transistors and source terminals of the transistors are connected to VDD, thereby to invert the polarity of the word-line initializing signal RESET (the word-line control elements 9 are activated at L level). It goes without saying that this can realize the same effect.

For facilitating the explanation of concept of the present invention, although the semiconductor memory device in FIG. 2 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device of the present embodiment, the word-line control circuit connected to the word line with a break (including the redundant word line) can be operated more reliably than in the first embodiment.

Embodiment 3

FIG. 3 shows a configuration view of a semiconductor memory device (SRAM) of a third embodiment according to the present invention.

The semiconductor memory device shown in FIG. 3 has memory cells 1, word-line drivers 2, a redundant word-line driver 3, a bit-line precharge control signal line driver 4, bit-line precharge circuits 5, word-line control circuits 6c, word lines WL1 and WL2, a redundant word-line RWL, pairs of bit lines BL1, /BL1 and BL2, /BL2, and a bit-line precharge control signal line PCGL. The word-line control circuit 6c has word-line control elements 8, 9 and a logical circuit 10. WLCG1 to WLCG 3, PCG, RESET and RED designate a word-line control signal, a bit-line precharge control signal, a word-line initializing signal, and a redundant selection signal, respectively. "A" indicates a break in the word line.

FIG. 15 is a circuit diagram showing the specific configuration of the memory cell 1, and FIG. 16 shows a diagram showing the specific configuration of the bit-line precharge circuit 5. The configuration is the same as that of the conventional example and therefore description thereof is omitted.

The word-line control circuit 6c is connected to the other ends of all of the word lines WL1, WL2 and the redundant word-line RWL (the end opposite to one end of each of the word lines and so on connected to the word-line drivers 2 and the redundant word-line driver 3, that is, distal end).

The word-line control circuit 6c of the semiconductor device of this embodiment has the configuration in which the inverter 7 in the word-line control circuit 6b of the semiconductor memory device of the second embodiment is replaced with the logical circuit 10 (NOR circuit in this embodiment) controlled by the redundant selection signal RED. The redundant selection signal RED is set at H level when no break occurs in the word lines (the redundant word-line is not used) and set at L level when a break occurs in the word lines (the redundant word-line is used). Operations of the semiconductor memory device of this embodiment thus constituted as mentioned above will be described below.

In the first or second embodiment, regardless of existence or absence of a break in the redundant word-line RWL or the word line WL, when the level of any one of the word lines WL1, WL2 and RWL changes, the output level of the inverter element 7 also changes concurrently with the change. However, in the case where no break occurs in all word lines, it is acceptable that the word-line control element 8 remains deactivated state (OFF state). Thus, input to the gate terminal of the word-line control element 8 requires to be fixed at L level.

In this embodiment, the word-line control element 8 is controlled by the redundant selection signal RED that outputs H level when no break occurs in the word lines (the redundant word line is not used) and outputs L level when a break occurs in the word lines and the logical circuit 10 that receives input of signal from the word line (including the redundant word line).

In other words, since the redundant selection signal RED outputs H level in the case where no break occurs in the word lines, the logical circuit 10 (NOR circuit) outputs L level at all times regardless of the input of the word line. Accordingly, all of the word-line control elements 8 to which the output of the logical circuit 10 is inputted to gate terminal thereof go into a deactivated state at all times.

Since the redundant selection signal RED outputs L level in the case where a break occurs in the word lines, the logical circuit 10 plays the same function of the inverter and the circuit of this embodiment shown in FIG. 3 performs the same operation as the circuit of the second embodiment shown in FIG. 2.

As described in the second embodiment, the word-line initializing signal RESET may be generated within the semiconductor memory device (SRAM) or may be a signal inputted from any device other than the semiconductor memory device (SRAM). Similarly to the second embodiment, this embodiment also has the configuration in which the word-line initializing signal RESET and the word-line control elements 9 are incorporated. Without these components, however, this embodiment can obtain the same effect as the first embodiment.

As described in the second embodiment, for the reliable relief of a break in the word lines, the word-line control circuit 6c is connected to all of the word lines including the redundant word line at the remotest point from one end of the respective word line connected to the word-line drivers 2 and the redundant word-line driver 3 (distal end of the word line et al).

In the semiconductor memory device shown in FIG. 3, in the configuration in which memory cells are activated when the word line or the redundant word line is at L level, the logical circuit 10 (NOR circuit) in the word-line control circuit 6c is changed to an NAND circuit, the polarity of the redundant selection signal RED is inverted, the word-line control elements 8, 9 are replaced with P-type MOS transistors and source terminals of the transistors are connected to VDD, thereby to invert the polarity of the word-line initializing signal RESET (the word-line control elements 9 are activated at L level). It goes without saying that this can realize the same effect.

For facilitating the explanation of concept of the present invention, although the semiconductor memory device in FIG. 3 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device according to the present embodiment, in the case where no break occurs in the word lines (redundancy relief is not conducted), the operation of the logical circuit 10 forming the word-line control circuit 6c is suspended by controlling the logical circuit 10 forming the word-line control circuit 6c with the redundant selection signal RED. This prevents pass-through current flowing at the time of switching of the logical circuit 10 and charging or discharging current from generating, resulting in smaller power consumption of the semiconductor memory device.

Embodiment 4

Figure 4:
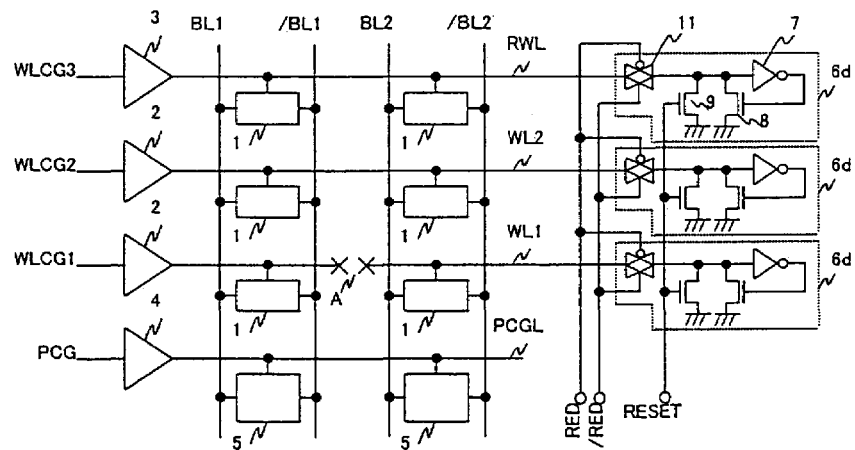
FIG. 4 is a configuration view of a semiconductor memory device of a fourth embodiment according to the present invention.

FIG. 4 shows a configuration view of a semiconductor memory device (SRAM) of a fourth embodiment according to the present invention.

The semiconductor memory device shown in FIG. 4 has memory cells 1, word-line drivers 2, a redundant word-line driver 3, a bit-line precharge control signal line driver 4, bit-line precharge circuits 5, word-line control circuits 6d, word lines WL1 and WL2, a redundant word-line RWL, pairs of bit lines BL1, /BL1 and BL2, /BL2, and a bit-line precharge control signal line PCGL. The word-line control circuit 6d has a word-line transfer element 11, an inverter element 7 and word-line control elements 8, 9.

WLCG1 to WLCG 3, PCG, RESET, RED and /RED designate a word-line control signal, a bit-line precharge control signal, a word-line initializing signal, a redundant selection signal and a redundant selection inverted signal, respectively. "A" indicates a break in the word line.

FIG. 15 is a circuit diagram showing the specific configuration of the memory cell 1, and FIG. 16 shows a diagram showing the specific configuration of the bit-line precharge circuit 5. The configuration is the same as that of the conventional example and therefore description thereof is omitted.

The word-line control circuit 6d is connected to the other ends of all of the word lines WL1, WL2 and the redundant word-line RWL (the end opposite to one end of each of the word lines and so on connected to the word-line drivers 2 and the redundant word-line driver 3, that is, distal end).

The word-line control circuit 6d of the semiconductor device of this embodiment has the configuration in which the word-line transfer element 11 (a transfer gate comprised of an N-type MOS transistor and an P-type MOS transistor in this embodiment) controlled by the redundant selection signal RED and the redundant selection inverted signal /RED is inserted between the word-line control circuit 6b and the word line (including the redundant word line) of the semiconductor device of the second embodiment shown in FIG. 2.

The word-line transfer element 11 is controlled by the redundant selection signal RED and the redundant selection inverted signal /RED. In the case where no break occurs in the word lines, the redundant selection signal RED becomes H level, the redundant selection inverted signal /RED becomes L level and the word-line transfer elements 11 go into a blocking state. In the case where a break occurs in the word lines, the redundant selection signal RED becomes L level, the redundant selection inverted signal /RED becomes H level and the word-line transfer elements 11 go into a conducting state.

Operations of the semiconductor memory device of this embodiment thus constituted as mentioned above will be described below.

As described in the third embodiment, in the first or second embodiment, regardless of existence or absence of a break in the redundant word-line RWL or the word line WL, when the level of any one of the word lines WL1, WL2 and RWL changes, the output level of the inverter element 7 also changes concurrently with the change. However, in the case where no break occurs in all word lines, it is acceptable that the word-line control circuit remains deactivated state (non-operating state) at all times.

In this embodiment, the circuit (the word-line control circuit 6d in FIG. 4) is configured so as not to transmit change in the word line to the inverter element 7 at next stage, in the case where redundancy relief is not conducted, by inserting the word-line transfer element 11 (a transfer gate formed of an N-type MOS transistor and a P-type MOS transistor in this embodiment) controlled by the redundant selection signal RED and the redundant selection inverted signal /RED between the word line (including the redundant word line) and the word-line control circuit 6b (FIG. 2).

In the case where no break occurs in the word lines, the redundant selection signal RED outputs H level and the redundant selection inverted signal /RED outputs L level to block the word-line transfer element 11. The word-line transfer element 11 does not transmit the signal from the word lines to the inverter element 7 at next stage. In the case where a break occurs in the word lines, the redundant selection signal RED outputs L level and the redundant selection inverted signal /RED outputs H level to bring the word-line transfer element 11 into conduction. The word-line transfer element 11 transmits the signal from the word lines as it is to the inverter elements 7.

In other words, since the word-line transfer element 11 is blocked in the case where no break occurs in the word lines, the inverter element 7 at next stage goes into a deactivated state (non-operating state). Since the word-line transfer element 11 is in a conductive state in the case where a break occurs in the word lines, the word-line control circuit 6d performs the same operation as the word-line control circuit 6*b* shown in FIG. 2 and the circuit of this embodiment shown in FIG. 4 performs the same operation as the circuit of the second embodiment shown in FIG. 2.

As described in the second embodiment, the word-line initializing signal RESET may be generated within the semiconductor memory device (SRAM) or may be a signal inputted from any device other than the semiconductor memory device (SRAM). Similarly to the first embodiment, this embodiment has the configuration in which the word-line initializing signal RESET and the word-line control elements 9 are incorporated. Without these components, however, this embodiment can obtain the same effect as the first embodiment.

As described in the second embodiment, for the reliable relief of a break in the word line, the word-line control circuit 6*d* is connected to all of the word lines including the redundant word line at the remotest point from one end of the respective word line connected to the word-line drivers 2 and the redundant word-line driver 3 (distal end of the word line et al).

In the semiconductor memory device shown in FIG. 4, in the configuration in which memory cells are activated when the word line or the redundant word line is at L level, the word-line control elements 8, 9 forming the word-line control circuit 6*d* are replaced with P-type MOS transistors and source terminals of the transistors are connected to VDD, thereby to invert the polarity of the word-line initializing signal RESET (the word-line control elements 9 are activated at L level). It goes without saying that this can realize the same effect.

For facilitating the explanation of concept of the present invention, although the semiconductor memory device in FIG. 4 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device according to the present embodiment, in the case where no break occurs in the word lines (redundancy relief is not conducted), the operation of the inverter element 7 at next stage is suspended by controlling the word-line transfer element 11 forming the word-line control circuit 6*d* with the redundant selection signal RED and the redundant selection inverted signal /RED so as to block the word-line transfer element 11 forming the word-line control circuit 6*d*. This prevents pass-through current flowing at the time of switching of the inverter element 7 and charging or discharging current from generating, resulting in smaller power consumption of the semiconductor memory device.

Embodiment 5

Figure 5:
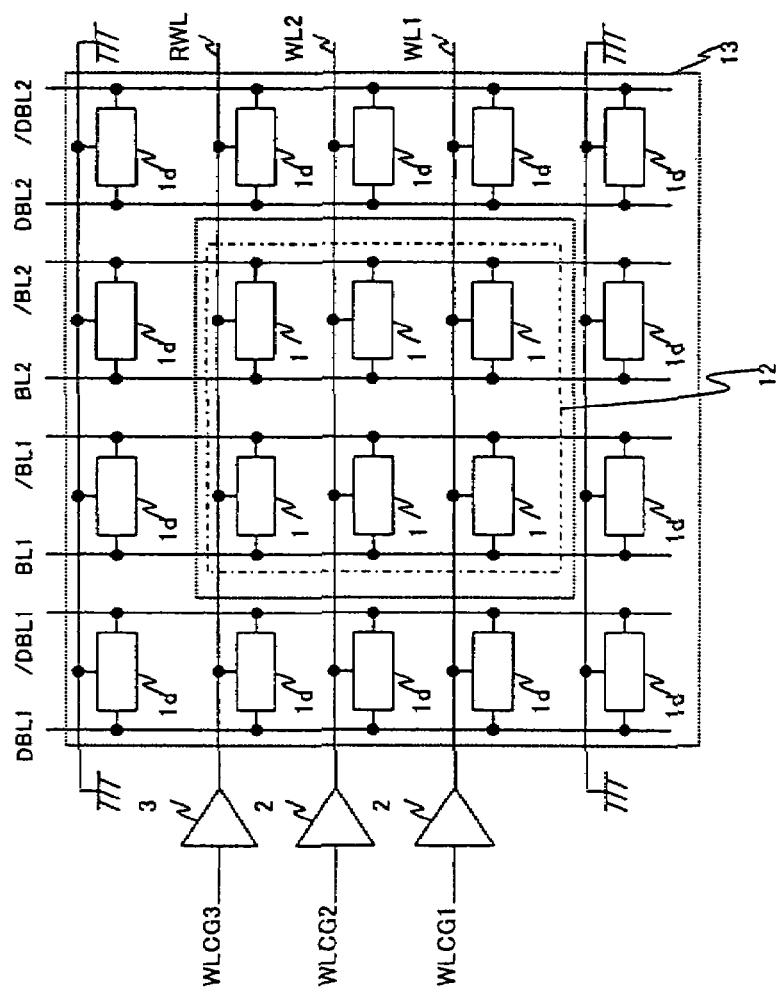
FIG. 5 is a configuration view showing a memory cell array of a semiconductor memory device of a fifth embodiment according to the present invention.

FIG. 5 shows a configuration view of a semiconductor memory device (SRAM) of a fifth embodiment according to the present invention.

The semiconductor memory device shown in FIG. 5 has memory cells 1, dummy memory cells 1*d*, word-line drivers 2, a redundant word-line driver 3, a memory cell array 12, a dummy memory cell array 13, word lines WL1 and WL2, a redundant word-line RWL, pairs of bit lines BL1, /BL1 and BL2, /BL2, and pairs of dummy bit lines DBL1, /DBL1 and DBL2, /DBL2 (a bit-line precharge circuit 5 and so on are not shown).

The specific circuit configuration of the memory cell 1 and the dummy memory cell 1*d* in FIG. 5 are the same as that shown in FIG. 15.

These days, in the semiconductor memory device, to process the shape of the memory cell array 12 stably as the process becomes more minute, the dummy memory cell array 13 is generally located around the memory cell array 12. Typically, the dummy memory cell 1*d* has the same configuration as the memory cell 1. The dummy memory cells 1*d* are only disposed on the periphery of the memory cell array 12. As distinct from the memory cell 1, the dummy memory cell 1*d*, independent of circuit operation, is not used for storing and holding data.

In this embodiment, the word-line control circuits 6*a* to 6*d* are realized by modifying the circuit configuration of all or part of dummy memory cells 1*d*. In this embodiment, the word-line control circuits are realized by modifying only the wiring layer of the dummy memory cell 1*d*.

FIG. 6 shows an example of the specific circuit diagram of the dummy memory cell in the semiconductor memory device of the first embodiment. The word-line control circuit 6*a* is realized by using the dummy memory cell 1*d*.

FIG. 6 shows an access transistor Q2, a drive transistor Q3, a load transistor Q5, a word line WL, a pair of dummy bit lines DBL, /DBL and a power source terminal VDD.

Q4 and Q6 that function as a drive transistor and a load transistor respectively in the normal memory cell are used as the inverter element 7 in memory cell of this embodiment. Q1 that functions as an access transistor in general is used as the word-line control element 8.

The gate terminals of the drive transistor Q4 and the load transistor Q6 forming the inverter 7 are connected to the word line WL and the output of the inverter element 7 is connected to the gate terminal of the access transistor Q1 used as the word-line control element. The drain terminal of the access transistor Q1 used as the word-line control element 8 is connected to ground and source terminal thereof is connected to the word line WL.

Each gate terminal of the other transistors Q2, Q3 and Q5 not used is connected to ground so as to prevent unnecessary current from flowing. This can constitute the word-line control circuit 6*a* by using the dummy memory cell 1*d*.

The configuration shown in FIG. 6 is just an example, and needless to say, even if the way to connect the transistors Q1 to Q6 in the dummy memory cell 1*d* is changed, the same configuration can be realized.

FIG. 7 shows an example of the specific circuit diagram of the dummy memory cell in the semiconductor memory device of the second embodiment. The word-line control circuit 6*b* is realized by using the dummy memory cell 1*d*.

FIG. 7 shows a drive transistor Q3, a load transistor Q5, a word line WL, a pair of dummy bit lines DBL, /DBL and a power source terminal VDD.

Q4 and Q6 that function as a drive transistor and a load transistor respectively in the normal memory cell are used as the inverter element 7 in memory cell of this embodiment. Q1 that functions as an access transistor in general is used as the word-line control element 8. Furthermore, Q2 that functions as an access transistor in general is used as the word-line control element 9.

The gate terminals of the drive transistor Q4 and the load transistor Q6 used as the inverter 7 are connected to the word line WL and the output of the inverter element 7 is connected to the gate terminal of the access transistor Q1 used as the word-line control element. The drain terminal of the access transistor Q1 used as the word-line control element 8 is connected to ground and source terminal thereof is connected to the word line WL. The word-line initializing signal RESET is inputted to the gate terminal of the access transistor Q2 used as the word-line control element 9. The source terminal of the transistor Q2 is connected to the word line WL and drain terminal thereof is connected to ground.

Each gate terminal of the other transistors Q3 and Q5 not used is connected to ground so as to prevent unnecessary current from flowing. This can constitute the word-line control circuit 6b by using the dummy memory cell 1d.

The configuration shown in FIG. 7 is just an example, and needless to say, even if the way to connect the transistors Q1 to Q6 in the dummy memory cell 1d is changed, the same configuration can be realized.

Figure 8:
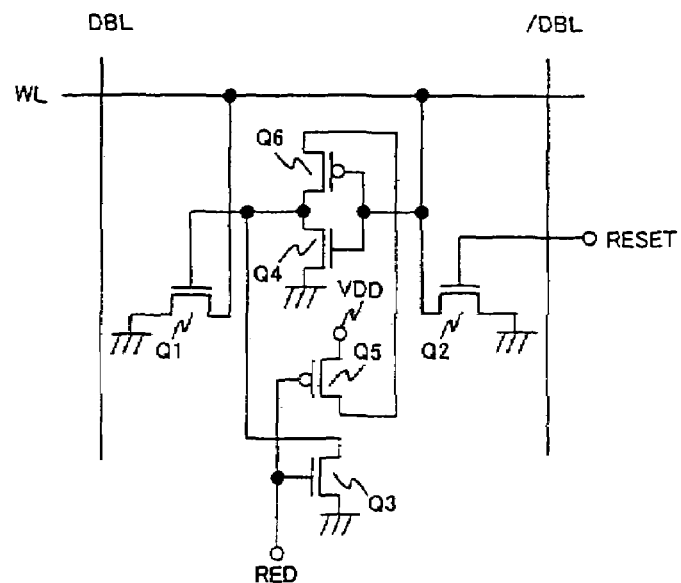
FIG. 8 is an example of a specific circuit configuration in which a word-line control circuit is configured by using a dummy memory cell of the semiconductor memory device of the fifth embodiment according to the present invention.

FIG. 8 shows an example of the specific circuit diagram of the dummy memory cell in the semiconductor memory device of the third embodiment. The word-line control circuit 6c is realized by using the dummy memory cell 1d.

FIG. 8 shows a word line WL, a pair of dummy bit lines DBL, /DBL and a power source terminal VDD.

Q3 and Q4 that function as a drive transistor in the normal memory cell and Q5 and Q6 that function as a load transistor in the normal memory cell are used as the logical circuit 10 (NOR circuit) in memory cell of this embodiment. Q1 that functions as an access transistor in general is used as the word-line control element 8. Furthermore, Q2 that functions as an access transistor in general is used as the word-line control element 9.

One input terminal (gate terminal of the transistors Q4 and Q6) of the drive transistors Q3 and Q4 and the load transistors Q5 and Q6 used as the logical circuit 10 (NOR circuit) is connected to the word line WL and the other input terminal (gate terminal of the transistors Q3 and Q5) is connected to the redundant selection signal RED. The output of the logical circuit 10 is connected to the gate terminal of the access transistor Q1 used as the word-line control element 8.

The drain terminal of the access transistor Q1 used as the word-line control element 8 is connected to ground and source terminal thereof is connected to the word line WL. The word-line initializing signal RESET is inputted to the gate terminal of the access transistor Q2 used as the word-line control element 9. The source terminal of the access transistor Q2 is connected to the word line WL and drain terminal thereof is connected to ground. This can constitute the word-line control circuit 6c by using the dummy memory cell 1d.

The configuration shown in FIG. 8 is just an example, and needless to say, even if the way to connect the transistors Q1 to Q6 in the dummy memory cell 1d is changed, the same configuration can be realized.

Figure 9:
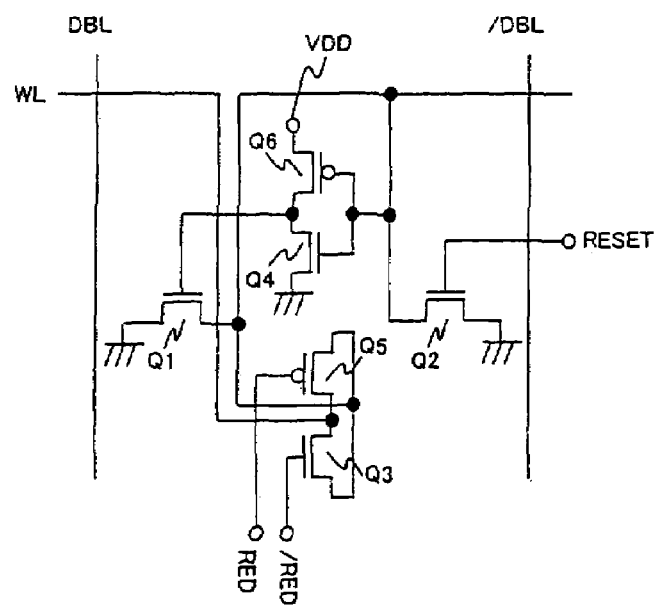
FIG. 9 is an example of a specific circuit configuration in which a word-line control circuit is configured by using a dummy memory cell of the semiconductor memory device of the fifth embodiment according to the present invention.

FIG. 9 shows an example of the specific circuit diagram of the dummy memory cell in the semiconductor memory device of the fourth embodiment. The word-line control circuit 6d is realized by using the dummy memory cell 1d.

FIG. 9 shows a word line WL, a pair of dummy bit lines DBL, /DBL and a power source terminal VDD.

Q4 and Q6 that function as a drive transistor and a load transistor respectively in the normal memory cell are used as the inverter element 7. Q1 that functions as an access transistor in general is used as the word-line control element 8. Furthermore, Q2 that functions as an access transistor in general is used as the word-line control element 9. Furthermore, Q3 and Q5 that functions as a drive transistor and a load transistor respectively in general are used as the word-line transfer element 11.

The redundancy selection signal RED is inputted to the gate terminal of the load transistor Q5 of the drive transistor Q3 and the load transistor Q5 used as the word-line transfer element 11 (a transfer gate formed of an N-type MOS transistor and a P-type MOS transistor) and the redundancy selection inverted signal /RED is inputted to the gate terminal of the drive transistor Q3.

One end (input terminal) of the word-line transfer element 11 is connected to the word line WL. The other end (output terminal) of the word-line transfer element 11 is connected to the drain terminals of the word-line control elements 8, 9 and the gate terminal of the drive transistor Q4 and the load transistor Q6 used as the inverter element 7.

The output terminal of the inverter element 7 is the gate terminal of Q1 used as the word-line control element.

The drain terminal of the access transistor Q1 used as the word-line control element 8 is connected to ground and source terminal thereof is connected to the other end of the word-line transfer element 11. The word-line initializing signal RESET is inputted to the gate terminal of the access transistor Q2 used as the word-line control element 9. The source terminal of the access transistor Q2 is connected to the output terminal of the word-line transfer element 11 and drain terminal thereof is connected to ground. This can constitute the word-line control circuit 6d by using the dummy memory cell 1d.

The configuration shown in FIG. 9 is just an example, and needless to say, even if the way to connect the transistors Q1 to Q6 in the dummy memory cell 1d is changed, the same configuration can be realized.

As described in the first to fourth embodiment, for the reliable relief of a break in the word line, it is desirable to use the dummy memory cell 1d located at the remotest point from one end of the respective word line connected to the word-line drivers 2 and the redundant word-line driver 3 (distal end of the word line et al).

Preferably, by changing only wiring layer without modifying the pattern of the semiconductor substrate, the word-line control circuits 6a to 6d are constituted by using the dummy memory cell 1d. This doesn't destabilize processing shape of the memory cell array 12 even when the word-line control circuit is constituted by using any of the transistors Q1 to Q6 that form the dummy memory cell 1d.

By constituting the word-line control circuits 6a to 6d in the first to fourth embodiments by use of transistors forming the dummy memory cell 1d in FIG. 5, increase in the layout area of the semiconductor memory device can be suppressed.

Embodiment 6

Figure 10:
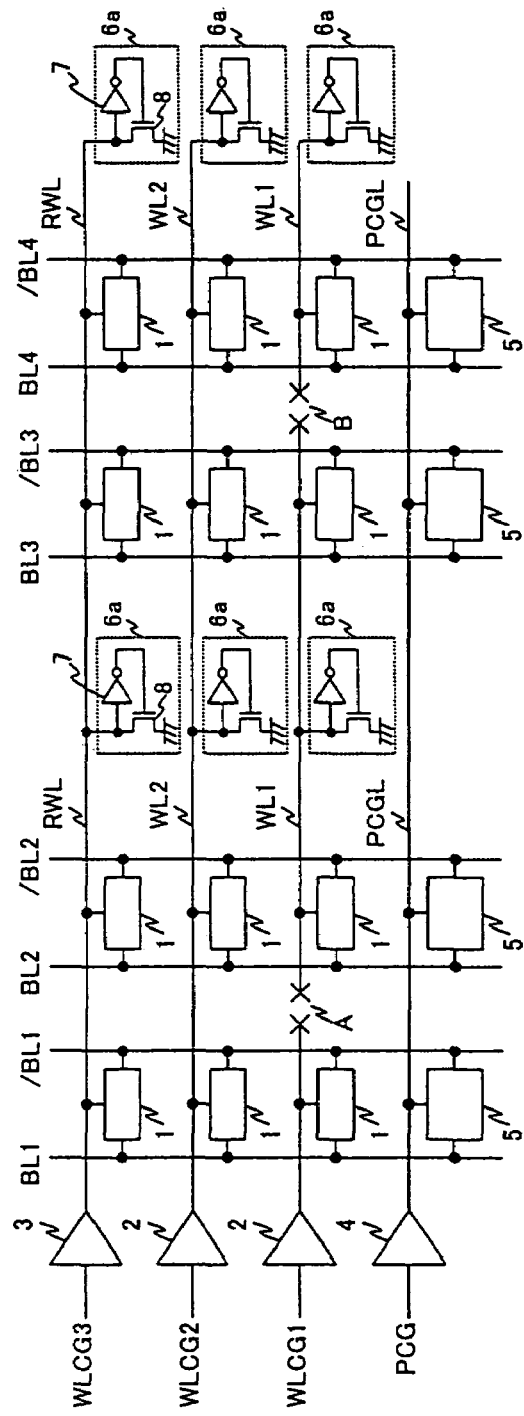
FIG. 10 is a configuration view of a semiconductor memory device of a sixth embodiment according to the present invention.

FIG. 10 shows a configuration view of a semiconductor memory device (SRAM) of a sixth embodiment according to the present invention.

The semiconductor memory device shown in FIG. 10 has memory cells 1, word-line drivers 2, a redundant word-line driver 3, a bit-line precharge control signal line driver 4, bit-line precharge circuits 5, word-line control circuits 6a, word lines WL1 and WL2, a redundant word-line RWL, pairs of bit lines BL1 to BL4 and /BL1 to /BL4, respectively, and a bit-line precharge control signal line PCGL. The word-line control circuit 6a has an inverter element 7 and a word-line control element 8. WLCG1 to WLCG 3 and PCG designate a word-line control signal and a bit-line precharge control signal, respectively. "A" and "B" indicate multiple breaks in the same word line.

FIG. 15 is a circuit diagram showing the specific configuration of the memory cell 1, and FIG. 16 shows a diagram showing the specific configuration of the bit-line precharge circuit 5. The configuration is the same as that of the conventional examples and therefore description thereof is omitted.

The semiconductor memory device of this embodiment has a similar configuration to the first embodiment. While the word-line control circuit 6a is connected to the word lines only at the remotest point (distal end) from one end of the respective word line connected to the word-line driver 2 or the redundant word-line driver 3 in the first embodiment, the word-line control circuit 6a is connected to the word lines also at any point other than the both ends of the respective word line (any point other than one end and the other end of the respective word line connected to the word-line drivers and the redundant word-line driver) in this embodiment. The operation of each word-line control circuit 6a is the same as that of the first embodiment.

Operations of the semiconductor memory device of this embodiment thus constituted as mentioned above will be described below.

While the circuit configuration of the first embodiment can address the case where only one break (A in FIG. 1) occurs in the same word line, it cannot address the case where multiple breaks (A and B) occurs in the same word line as shown in FIG. 10. That is, in FIG. 10, supposing that the word-line control circuit 6a is not connected to the word line with a break at the point other than the both ends thereof, the word line goes into a floating state between the break points A and B. For that reason, the following problems can arise: collision between data of memory cells occurs, thereby to damage data in memory cells 1 connected to the normal word line and pass-through current flows between the memory cell and the bit-line precharge circuit in the period during which the pairs of bit lines are precharged.

In this embodiment, as shown in FIG. 10, the above-mentioned problems can be solved by connecting the word-line control circuit 6a to the distal ends of all word lines including the redundant word line (the end opposite to one end of each of the word lines and so on connected to the word-line drivers 2 and the redundant word-line driver 3) and any point other than both ends of all word lines.

As shown in FIG. 10, the semiconductor device of this embodiment has the configuration capable of performing redundancy relief in the case where two or more break points occur in the same word line. By connecting the word-line control circuit 6a to the distal ends of all word lines including the redundant word line and multiple points other than both ends of the word lines, redundancy relief can be carried out at a higher probability when two break points occur in the same word line or even when three or more break points occur in the same word line.

In the semiconductor memory device shown in FIG. 10, in the configuration in which memory cells are activated when the word line or the redundant word line is at L level, the word-line control element 8 of the word-line control circuit 6a is replaced with a P-type MOS transistor and source terminal of the transistor is connected to VDD. It goes without saying that this can realize the same effect.

For facilitating the explanation of concept of the present invention, although the semiconductor memory device in FIG. 10 consists of small number of memory cell, word-line driver, redundant word-line driver, word line, redundant word line, pair of bit-lines, word line control circuit and so on, the number of each element may be plural (or numerous) and of course, there causes no change in effect.

As described above, in the semiconductor memory device according to the present invention, by connecting the word-line control circuit to the distal ends of all word lines including the redundant word line and one or more points other than both ends of the word lines, the following problems can be prevented; collision between data of the memory cells connected to one word line with multiple break points and data of memory cells connected to the normal word lines occurs through the pairs of bit lines, and pass-through current flows between the memory cells connected to one word line with multiple break points and the bit-line precharge circuits in the period during which the pairs of bit lines are precharged. Furthermore, it is possible to improve the probability of capable of reliably performing redundancy relief of a break in the word line of the semiconductor memory device. Furthermore, in contrast to the conventional examples, since the semiconductor memory device of this embodiment has the configuration in which the word line with a break never goes into a floating state while the word line is activated, redundancy relief can be conducted more reliably. Moreover, since the word-line control circuit is constituted so that it is controlled by the word line itself, there is no need to constitute the circuit while taking account of operation timing of the word line and other signal, resulting in lower power consumption. Furthermore, by using the MOS transistor having an inverse narrow width effect as the word-line control element, the word-line control circuit connected to the word line with a break can be operated reliably at the time of startup and so on.

By combining the invention of this embodiment with that of the fifth embodiment and constituting the word-line control circuit 6a by use of transistors (Q1 to Q6 transistors in FIG. 15) forming the dummy memory cell 1d, increase in the layout area of the semiconductor memory device can be suppressed.

Embodiment 7

Figure 11:
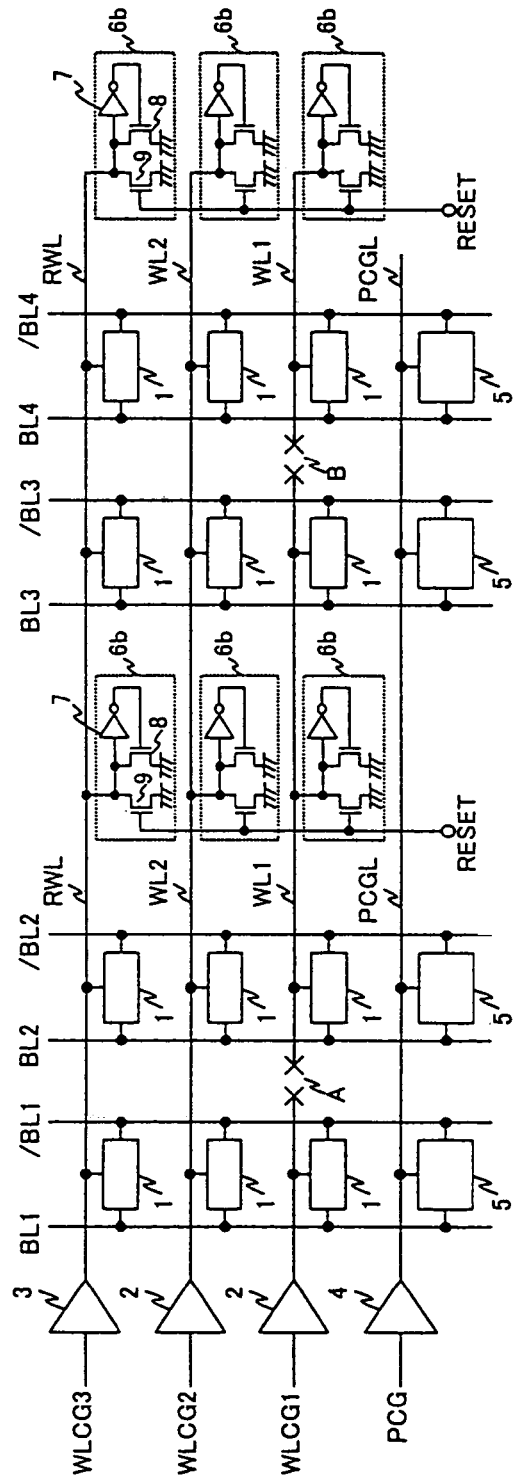
FIG. 11 is a configuration view of a semiconductor memory device of a seventh embodiment according to the present invention.

FIG. 11 shows a configuration view of a semiconductor memory device (SRAM) of a seventh embodiment according to the present invention.

The semiconductor memory device shown in FIG. 11 has memory cells 1, word-line drivers 2, a redundant word-line driver 3, a bit-line precharge control signal line driver 4, bit-line precharge circuits 5, word-line control circuits 6b, word lines WL1 and WL2, a redundant word-line RWL, pairs of bit lines BL1 to BL4 and /BL1 to /BL4, respectively, and a bit-line precharge control signal line PCGL. The word-line control circuit 6b has an inverter element 7 and word-line control elements 8, 9.

WLCG1 to WLCG 3, PCG and RESET designate a word-line control signal, a bit-line precharge control signal and a word-line initializing signal, respectively. "A" and "B" indicate multiple breaks in the same word line.

FIG. 15 is a circuit diagram showing the specific configuration of the memory cell 1, and FIG. 16 shows a diagram showing the specific configuration of the bit-line precharge circuit 5. The configuration is the same as that of the conventional examples and therefore description thereof is omitted.

The semiconductor memory device of this embodiment has the configuration in which the word-line control circuit 6a of the semiconductor memory device of the sixth embodiment shown in FIG. 10 is replaced with the word-line control circuit 6b (second embodiment). While the word-line control circuit 6b is connected to the word lines only at the remotest point (distal end) from one end of the respective word line connected to the word-line driver 2 or the redundant word-line driver 3 in the second embodiment, the word-line control circuit 6b is connected to the word lines also at any point other than the remotest point (distal end)

from the connecting point of the respective word line with the word-line drivers 2 or the redundant word-line driver 3 (any point other than both ends of the word lines) in this embodiment. The operation of each word-line control circuit 6b is the same as that of the second embodiment.

Operations of the semiconductor memory device of this embodiment thus constituted as mentioned above will be described below.

When the word-line initializing signal RESET is at L level, all of the word-line control elements 9 controlled by the word-line initializing signal RESET go into a deactivated state and therefore it is obvious to perform the same operations as in the first or sixth embodiment.

In this embodiment, the word-line initializing signal RESET is made to be at H level at least once during the period between turn-on of the power and start of normal operation (the state in which writing or reading data to/from is performed), thereby to activate the word-line control elements 9.

The parts of the word line WL1 with multiple break points between the break points A and B and on the right side from the break point B are sure to become L level through the word-line control element 9 during the period from turn-on of the power to normal operation. Once the parts of the word line WL1 between the break points A and B and on the right side from the break point B are made to become L level, these parts are stably latched at L level at all times. Thus, the parts of the word line WL1 between the break points A and B and on the right side from the break point B never go into a floating state. The word-line initializing signal RESET may be generated within the semiconductor memory device (SRAM). Alternatively, it may be a signal inputted from any device other than the semiconductor memory device (SRAM).

As shown in FIG. 11, the semiconductor device of this embodiment has the configuration capable of performing redundancy relief in the case where two break points occur in the same word line. By connecting the word-line control circuit 6b to the distal ends of all word lines including the redundant word line and multiple points other than both ends of the word lines, redundancy relief can be carried out at a higher probability when two break points occur in the same word line or even when three or more break points occur in the same word line.

In the semiconductor memory device shown in FIG. 11, in the configuration in which memory cells are activated when the word line or the redundant word line is at L level, the word-line control elements 8, 9 are replaced with P-type MOS transistors and source terminals of the transistors are connected to VDD, thereby to invert the polarity of the word-line initializing signal RESET (the word-line control element 9 is activated at L level) It goes without saying that this can realize the same effect.

For facilitating the explanation of concept of the present invention, although the semiconductor memory device in FIG. 11 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device of this embodiment, the word-line control circuit connected to the word line with a break (including the redundant word line) can be operated more reliably than in the sixth embodiment.

By combining the invention of this embodiment with that of the fifth embodiment and constituting the word-line control circuit 6b by use of transistors (Q1 to Q6 transistors in FIG. 15) forming the dummy memory cell 1d, increase in the layout area of the semiconductor memory device can be suppressed.

Embodiment 8

Figure 12:
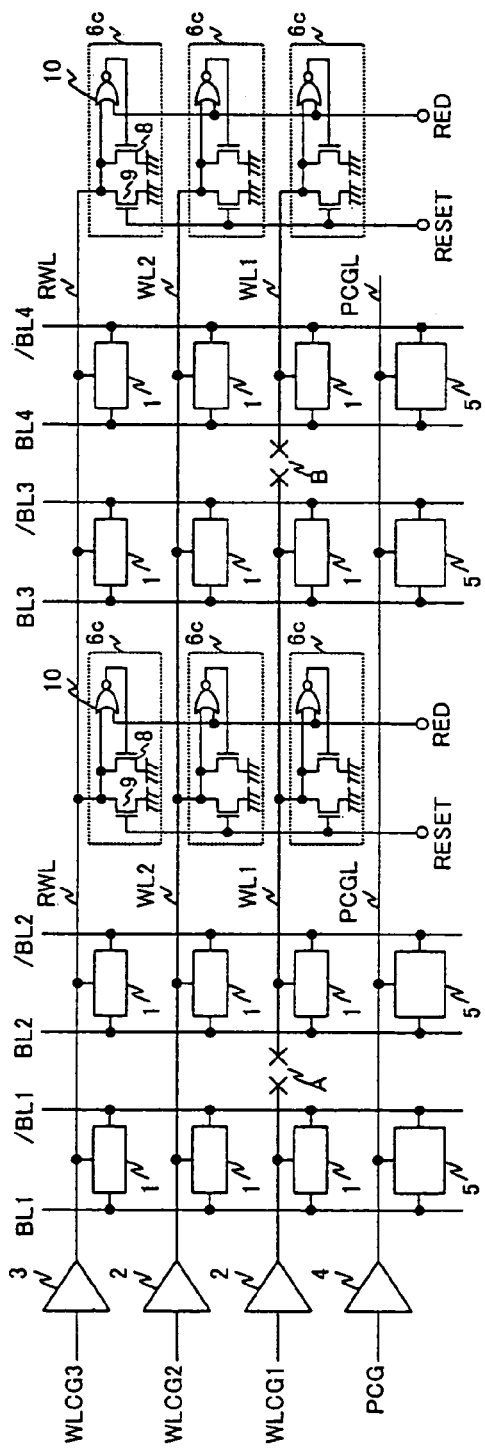
FIG. 12 is a configuration view of a semiconductor memory device of an eighth embodiment according to the present invention.

FIG. 12 shows a configuration view of a semiconductor memory device (SRAM) of an eighth embodiment according to the present invention.

The semiconductor memory device shown in FIG. 12 has memory cells 1, word-line drivers 2, a redundant word-line driver 3, a bit-line precharge control signal line driver 4, bit-line precharge circuits 5, word-line control circuits 6c, word lines WL1 and WL2, a redundant word-line RWL, pairs of bit lines BL1 to BL4 and /BL1 to /BL4, respectively, and a bit-line precharge control signal line PCGL. The word-line control circuit 6c has word-line control elements 8, 9 and a logical circuit 10.

WLCG1 to WLCG 3, PCG, RESET and RED designate a word-line control signal, a bit-line precharge control signal, a word-line initializing signal and a redundant selection signal, respectively. "A" and "B" indicate multiple breaks in the same word line.

FIG. 15 is a circuit diagram showing the specific configuration of the memory cell 1, and FIG. 16 shows a diagram showing the specific configuration of the bit-line precharge circuit 5. The configuration is the same as that of the conventional examples and therefore description thereof is omitted.

The semiconductor memory device of this embodiment has the configuration in which the word-line control circuit 6a of the semiconductor memory device of the sixth embodiment shown in FIG. 10 is replaced with the word-line control circuit 6c (third embodiment). While the word-line control circuit 6c is connected to the word lines only at the remotest point (distal end) from one end of the respective word line connected to the word-line driver 2 or the redundant word-line driver 3 in the third embodiment, the word-line control circuit 6c is connected to the word lines also at any point other than the remotest point (distal end) from the connecting point of the respective word line with the word-line drivers or the redundant word-line driver (any point other than both ends of the word lines) in this embodiment. The operation of each word-line control circuit 6c is the same as that of the third embodiment.

Operations of the semiconductor memory device of this embodiment thus constituted as mentioned above will be described below.

In the sixth or seventh embodiment, regardless of existence or absence of a break in the redundant word-line RWL or the word line WL, when the level of any one of the word lines WL1, WL2 and RWL changes, the output level of the inverter element 7 also changes concurrently with the change. However, in the case where no break occurs in all word lines, it is acceptable that the word-line control element 8 remains deactivated state (blocking state) at all times. Thus, input to the gate terminal of the word-line control element 8 requires to be fixed at L level.

In this embodiment, the word-line control element 8 is controlled by the redundant selection signal RED that outputs H level when no break occurs in the word lines (the redundant word line is not used) and outputs L level when a break occurs in the word lines and the logical circuit 10 that receives input of signal from the word line (including the redundant word line).

In other words, since the redundant selection signal RED outputs H level in the case where no break occurs in the word lines, the logical circuit 10 (NOR circuit) outputs L level at all times regardless of the input of the word line. Accordingly, all of the word-line control elements 8 to which the output of the logical circuit 10 is inputted to gate terminals thereof go into a deactivated state at all times.

Since the redundant selection signal RED outputs L level in the case where a break occurs in the word lines, the logical circuit 10 plays the same function of the inverter and the circuit of this embodiment shown in FIG. 12 performs the same operation as the circuit of the seventh embodiment shown in FIG. 11.

As described in the second or seventh embodiment, the word-line initializing signal RESET may be generated within the semiconductor memory device (SRAM) or may be a signal inputted from any device other than the semiconductor memory device (SRAM). This embodiment has the configuration in which the word-line initializing signal RESET and the word-line control elements 9, which are described in the second and seventh embodiment, are incorporated. Without these components, however, this embodiment can obtain the same effect as the first and sixth embodiments.

As shown in FIG. 12, the semiconductor device of this embodiment has the configuration capable of performing redundancy relief in the case where two or more break points occur in the same word line. By connecting the word-line control circuit 6c to the distal ends of all word lines including the redundant word line and multiple points other than both ends of the word lines, redundancy relief can be carried out at a higher probability when two break points occur in the same word line or even when three or more break points occur in the same word line.

In the semiconductor memory device shown in FIG. 12, in the configuration in which memory cells are activated when the word line or the redundant word line is at L level, the logical circuit 10 (NOR circuit) in the word-line control circuit 6c is replaced with an NAND circuit, the polarity of the redundant selection signal RED is inverted, the word-line control elements 8, 9 are replaced with P-type MOS transistors and source terminals of the transistors are connected to VDD, thereby to invert the polarity of the word-line initializing signal RESET (the word-line control elements 9 are activated at L level). It goes without saying that this can realize the same effect.

For facilitating the explanation of concept of the present invention, although the semiconductor memory device in FIG. 12 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device according to the present embodiment, in the case where no break occurs in the word lines (redundancy relief is not conducted), the operation of the logical circuit 10 forming the word-line control circuit 6c is suspended by controlling the logical circuit 10 forming the word-line control circuit 6c with the redundant selection signal RED. This prevents pass-through current flowing at the time of switching of the logical circuit 10 and charging or discharging current from generating, resulting in smaller power consumption of the semiconductor memory device.

By combining the invention of this embodiment with that of the fifth embodiment and constituting the word-line control circuit 6c by use of transistors (Q1 to Q6 transistors in FIG. 15) forming the dummy memory cell 1d, increase in the layout area of the semiconductor memory device can be suppressed.

Embodiment 9

Figure 13:
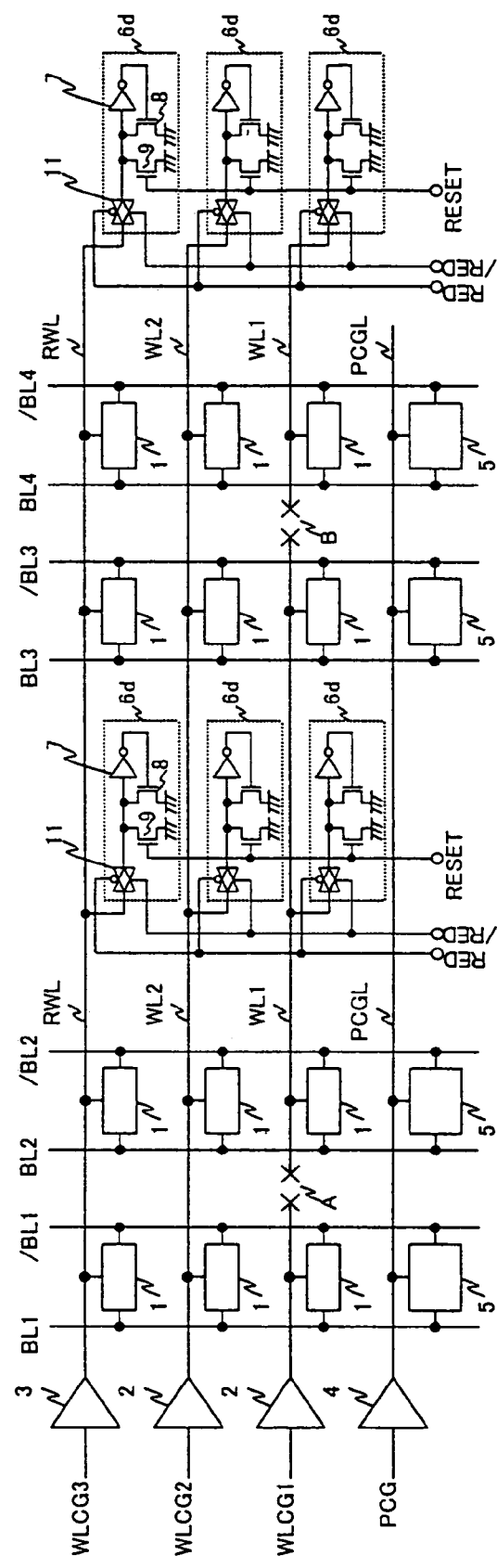
FIG. 13 is a configuration view of a semiconductor memory device of a ninth embodiment according to the present invention.
Figure 14:
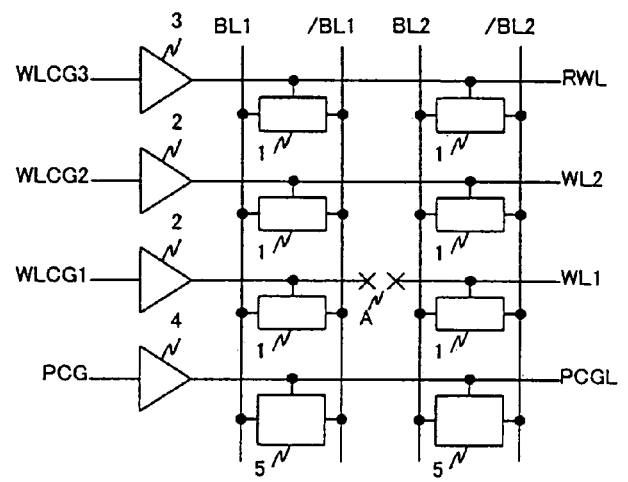
FIG. 14 is a configuration view of a semiconductor device of a first conventional example.

FIG. 13 shows a configuration view of a semiconductor memory device (SRAM) of a ninth embodiment according to the present invention.

The semiconductor memory device shown in FIG. 13 has memory cells 1, word-line drivers 2, a redundant word-line driver 3, a bit-line precharge control signal line driver 4, bit-line precharge circuits 5, word-line control circuits 6d, word lines WL1 and WL2, a redundant word-line RWL, pairs of bit lines BL1 to BL4 and /BL1 to /BL4, respectively, and a bit-line precharge control signal line PCGL. The word-line control circuit 6d has an inverter element 7, word-line control elements 8, 9 and a word-line transfer element 11.

WLCG1 to WLCG 3, PCG, RESET, RED and /RED designate a word-line control signal, a bit-line precharge control signal, a word-line initializing signal, a redundant selection signal and a redundant selection inverted signal, respectively. "A" and "B" indicate multiple breaks in the same word line.

FIG. 15 is a circuit diagram showing the specific configuration of the memory cell 1, and FIG. 16 shows a diagram showing the specific configuration of the bit-line precharge circuit 5. The configuration is the same as that of the conventional examples and therefore description thereof is omitted.

The semiconductor memory device of this embodiment has the configuration in which the word-line control circuit 6a of the semiconductor memory device of the sixth embodiment shown in FIG. 10 is replaced with the word-line control circuit 6d (fourth embodiment). While the word-line control circuit 6d is connected to the word lines only at the remotest point (distal end) from one end of the respective word line connected to the word-line driver 2 or the redundant word-line driver 3 in the fourth embodiment, the word-line control circuit 6d is connected to the word lines also at any point other than the remotest point (distal end) from the connecting point of the respective word line with the word-line drivers or the redundant word-line driver (any point other than both ends of the word lines) in this embodiment. The operation of each word-line control circuit 6d is the same as that of the fourth embodiment.

Operations of the semiconductor memory device of this embodiment thus constituted as mentioned above will be described below.

As described in the eighth embodiment, in the sixth or seventh embodiment, regardless of existence or absence of a break in the redundant word-line RWL or the word line WL, when the level of any one of the word lines WL1, WL2 and RWL changes, the output level of the inverter element 7 also changes concurrently with the change. However, in the case where no break occurs in all word lines, it is acceptable that the word-line control element 8 remains deactivated state (non-operating state) at all times.

Thus, in this embodiment, the circuit (the word-line control circuit 6d in FIG. 13) is configured so as not to transmit change in the word line to the inverter element 7 at next stage, in the case where redundancy relief is not conducted, by inserting the word-line transfer element 11 controlled by the redundant selection signal RED and the redundant selection inverted signal /RED (a transfer gate formed of an N-type MOS transistor and a P-type MOS transistor in this embodiment) between the word line (including the redundant word line) and the word-line control circuit 6b (FIG. 11).

In the case where no break occurs in the word lines, the redundant selection signal RED outputs H level and the redundant selection inverted signal /RED outputs L level to block the word-line transfer elements 11. The word-line transfer elements 11 do not transmit the signal from the word lines to the inverter elements 7 at next stage. In the case where a break occurs in the word lines, the redundant selection signal RED outputs L level and the redundant selection inverted signal /RED outputs H level to bring the word-line transfer elements 11 into conduction. The word-line transfer elements 11 transmit the signal from the word lines as it is to the inverter elements 7 at next stage.

In other words, since the word-line transfer element 11 is blocked in the case where no break occurs in the word lines, the inverter element 7 at next stage goes into a deactivated state (non-operating state). Since the word-line transfer element 11 is in a conductive state in the case where a break occurs in the word lines, the word-line control circuit 6d performs the same operation as the word-line control circuit 6b shown in FIG. 11 and the circuit of this embodiment shown in FIG. 13 performs the same operation as the circuit of the seventh embodiment shown in FIG. 11.

As described in the second or seventh embodiment, the word-line initializing signal RESET may be generated within the semiconductor memory device (SRAM) or may be a signal inputted from any device other than the semiconductor memory device (SRAM). This embodiment has the configuration in which the word-line initializing signal RESET and the word-line control elements 9, which are described in the second and seventh embodiments, are incorporated. Without these components, however, this embodiment can obtain the same effect as the first and sixth embodiments.

As shown in FIG. 13, the semiconductor device of this embodiment has the configuration capable of performing redundancy relief in the case where two break points occur in the same word line. By connecting the word-line control circuit 6d to the distal ends of all word lines including the redundant word line and multiple points other than both ends of the word lines, redundancy relief can be carried out at a higher probability when two break points occur in the same word line or even when three or more break points occur in the same word line.

In the semiconductor memory device shown in FIG. 13, in the configuration in which memory cells are activated when the word line or the redundant word line is at L level, the word-line control elements 8, 9 forming the word-line control circuit 6d are replaced with P-type MOS transistors and source terminals of the transistors are connected to VDD, thereby to invert the polarity of the word-line initializing signal RESET (the word-line control elements 9 are activated at L level). It goes without saying that this can realize the same effect.

For facilitating the explanation of concept of the present invention, although the semiconductor memory device in FIG. 13 consists of small number of memory cell, word-line driver, redundant word-line driver, word line, redundant word line, pair of bit-lines, word line control circuit and so on, the number of each device may be plural (or numerous) and of course, there causes no change in effect.

As described above, in the semiconductor memory device according to the present embodiment, in the case where no break occurs in the word lines (redundancy relief is not conducted), the word-line transfer element 11 forming the word-line control circuit 6d is blocked by controlling the word-line transfer element 11 forming the word-line control circuit 6d with the redundant selection signal RED and the redundant selection inverted signal /RED. As a result, the operation of the inverter element 7 at next stage is suspended, and pass-through current flowing at the time of switching of the inverter element 7 and charging or discharging current are prevented from generating, resulting in smaller power consumption of the semiconductor memory device.

By combining the invention of this embodiment with that of the fifth embodiment and constituting the word-line control circuit 6d by use of transistors (Q1 to Q6 transistors in FIG. 15) forming the dummy memory cell 1d, increase in the layout area of the semiconductor memory device can be suppressed.

As described above, in the semiconductor memory device according to the present embodiments, by connecting the word-line control circuit controlled by the word line itself to the distal ends of all word lines including the redundant word line, the following problems can be prevented; collision between data of the memory cells connected to one word line with multiple break points and data of memory cells connected to the normal word lines occurs through the pairs of bit lines, and pass-through current flows between the memory cells connected to one word line with multiple break points and the bit-line precharge circuits in the period during which the pairs of bit lines are precharged. Furthermore, it is possible to improve the probability of capable of reliably performing redundancy relief of a break in the word line of the semiconductor memory device. Furthermore, in contrast to the conventional examples, since the semiconductor memory device of this embodiment has the configuration in which the word line with a break never goes into a floating state while the word line is activated, redundancy relief can be conducted more reliably. Moreover, since the word-line control circuit is constituted so that it is controlled by the word line itself, there is no need to constitute the circuit while taking account of operation timing of the word line and other signal, resulting in lower power consumption.

Furthermore, in the semiconductor memory device of the present embodiments, by connecting the word-line control circuit controlled by the word line itself to the distal ends of all word lines including the redundant word line and one or more points other than both ends of the word lines, one word line with multiple breaks can be prevented from going into a floating state at a higher probability.

Furthermore, by using a MOS transistor having an inverse narrow width effect as the word-line control element, the word-line control circuit connected to the word line with a break can be operated reliably at the time of start-up and so on.

Furthermore, by adding the word-line control element controlled by the word-line initializing signal to the word-line control circuit, the word-line control circuit connected to the word line with a break can be operated reliably at the time of start-up and so on.

Furthermore, by constituting the logical circuit controlled by the redundant selection signal in the word-line control circuit, the operation of the word-line control circuit can be suspended in the case of no break in the word lines, resulting in lower power consumption in the semiconductor memory device.

Furthermore, by constituting the word-line transfer element controlled by the redundant selection signal in the word-line control circuit, the operation of the word-line control circuit can be suspended in the case of no break in the word lines, resulting in lower power consumption in the semiconductor memory device.

Furthermore, by constituting the word-line control circuit by use of the dummy memory cell, increase in the layout area of the semiconductor memory device can be suppressed.

While preferred embodiments of the present invention have been described in detail to a certain degree, it is to be understood that, within the scope and spirit of the claims made herein, the invention may be practiced otherwise than as specifically described herein, the invention may be modified in arrangement and detail without departing from such scope and spirit.

What is claimed is:

1. A semiconductor memory device comprising:
   a plurality of word lines including one or more redundant word lines;
   a plurality of pairs of bit lines;
   a plurality of memory cells connected to said plurality of word lines and said plurality of pairs of bit lines;
   a plurality of word-line drivers, each of which is connected to one end of each of said plurality of word lines and controlled by a plurality of word-line control signals; and
   a plurality of first word-line control circuits respectively located at the other ends of said plurality of word lines, each of said plurality of first word-line control circuits receiving a signal level of a corresponding one of said plurality of word lines, wherein
   in the case where the signal level of said corresponding word line is a first level at which corresponding ones of said plurality of memory cells connected to said corresponding word line go into a high impedance state, each of said plurality of first word-line control circuits switches to a conducting state and outputs a signal of said first level to said corresponding word line, and
   in the case where the signal level of said corresponding word line is a second level at which said corresponding memory cells go into a state wherein data input/output is performed, each of said plurality of first word-line control circuits switches to a non-conducting state.

2. A semiconductor memory device, as claimed in claim 1, further comprising a plurality of second word-line control circuits respectively located at points other than both ends of said plurality of word lines, each of said plurality of second word-line control circuits receiving a signal level of a corresponding one of said plurality of word lines, wherein
   in the case where the signal level of said corresponding word line is a first level at which corresponding ones of said plurality of memory cells connected to said corresponding word line go into a high impedance state, each of said plurality of second word-line control circuits switches to a conducting state and outputs a signal of said first level to said corresponding word line, and
   in the case where the signal level of said corresponding word line is a second level at which said corresponding memory cells go into a state wherein data input/output is performed, each of said plurality of second word-line control circuits switches to a non-conducting state.

3. A semiconductor memory device, as claimed in claim 1, wherein each of said first word-line control circuits comprises:
   an inverter element that receives input of the signal level of said word line; and
   a first word-line control element, coupled to said corresponding word line, that receives an output signal of said inverter element.

4. A semiconductor memory device, as claimed in claim 3, wherein each of said first word-line control circuits further comprises a second word-line control element that
   switches to a conducting state and outputs said first level of signal to said corresponding word line when a word-line initializing signal inputted at an initialization is inputted, and
   switches to a non-conducting state when said word-line initializing signal is not inputted.

5. A semiconductor memory device, as claimed in claim 3, wherein each of said plurality of first word-line control elements is formed of a MOS transistor having an inverse narrow width effect.

6. A semiconductor memory device as stated in claim 3, wherein current driving capacity of said first word-line control element is smaller than current driving capacity of a corresponding one of said word-line drivers.

7. A semiconductor memory device, as claimed in claim 1, wherein each of said plurality of first word-line control circuits comprises:
   a logical circuit that receives inputs of a redundant selection signal indicating whether redundancy relief is performed or not and the signal level of said corresponding word line; and
   a first word-line control element, coupled to said corresponding word-line, that receives an output signal of said logical circuit, wherein
   in the case where said redundant selection signal indicates that redundancy relief is performed and the signal level of said corresponding word line is said first level, said first word-line control element switches to a conducting state and outputs a signal of said first level to said corresponding word line, and
   in the case where said redundant selection signal indicates that redundancy relief is not performed or the signal level of said corresponding word line is said second level, said first word-line control element switches to a non-conducting state.

8. A semiconductor memory device, as claimed in claim 1, wherein each of said plurality of first word-line control circuits comprises a word-line transfer element, controlled by a redundant selection signal indicating whether redundancy relief is performed or not, between said corresponding word line and an input/output terminal for receiving the signal level of said corresponding word line and outputting an output signal to said corresponding word line, wherein
   in the case where said redundant selection signal indicates that redundancy relief is performed, said word-line transfer element switches to a conducting state and connects said input/output terminal to said corresponding word line, and
   in the case where said redundant selection signal indicates that redundancy relief is not performed, said word-line transfer element disconnects said input/output terminal from said corresponding word line.

9. A semiconductor memory device, as claimed in claim 1, wherein said plurality of first word-line control circuits are formed by using elements of dummy memory cells located around a memory cell array comprising said plurality of memory cells.

* * * * *